(12) United States Patent
Watanabe et al.

(10) Patent No.: US 7,812,412 B2
(45) Date of Patent: Oct. 12, 2010

(54) SEMICONDUCTOR DEVICE

(75) Inventors: Kouji Watanabe, Tokyo (JP); Nobuyuki Ikarashi, Tokyo (JP); Kouji Masuzaki, Tokyo (JP)

(73) Assignee: NEC Corporation, Tokyo (JP)

( * ) Notice: Subject to any disclaimer, the term of this patent is extended or adjusted under 35 U.S.C. 154(b) by 210 days.

(21) Appl. No.: 12/083,057

(22) PCT Filed: Sep. 21, 2006

(86) PCT No.: PCT/JP2006/318735

§ 371 (c)(1),
(2), (4) Date: Apr. 3, 2008

(87) PCT Pub. No.: WO2007/040057

PCT Pub. Date: Apr. 12, 2007

(65) Prior Publication Data

US 2009/0267163 A1 Oct. 29, 2009

(30) Foreign Application Priority Data

Oct. 4, 2005 (JP) .............................. 2005-291625

(51) Int. Cl.
*H01L 29/78* (2006.01)
(52) U.S. Cl. .............................. 257/411; 257/E29.255; 257/310; 257/410
(58) Field of Classification Search ......... 257/310–311, 257/374, 389, 410, 411, 506–508, 510, 520, 257/524, 632–651, 671, 752, 760
See application file for complete search history.

(56) References Cited

U.S. PATENT DOCUMENTS

2003/0127640 A1 7/2003 Eguchi et al.

(Continued)

FOREIGN PATENT DOCUMENTS

JP 2001-332547 11/2001

(Continued)

OTHER PUBLICATIONS

Y. Shimamoto, et al., "Advantages of gate work-function engineering by incorporating sub-monolayer Hf at SiON/poly-Si interface in low-power CMOS", 2005 Symposium on VLSI Technology Digest of Technical Papers, pp. 132-133.

(Continued)

*Primary Examiner*—Fernando L Toledo
*Assistant Examiner*—Mamadou Diallo
(74) *Attorney, Agent, or Firm*—McGinn IP Law Group, PLLC

(57) ABSTRACT

According to the present invention, a semiconductor device having a field effect transistor is provided. The field effect transistor comprises a gate insulating film 2 formed on a semiconductor layer 1 and a gate electrode 5 formed on the gate insulating film 2. The gate insulating film 2 has a silicon oxide film including a metal element 4 and nitrogen 3, and characteristics of the silicon oxide film are modified by adding the metal element 4 and nitrogen 3. Respective concentration distributions of the metal element 4 and nitrogen 3 in the gate insulating film 2 have maximum values on an interface side between the gate insulating film 2 and the gate electrode 5, and gradually decrease toward the semiconductor layer 1.

9 Claims, 27 Drawing Sheets

U.S. PATENT DOCUMENTS

| | | |
|---|---|---|
| 2004/0164329 A1 | 8/2004 | Hirano et al. |
| 2005/0233526 A1 | 10/2005 | Watanabe et al. |
| 2005/0247985 A1 | 11/2005 | Watanabe et al. |
| 2006/0043497 A1 | 3/2006 | Kimizuka et al. |
| 2006/0051978 A1* | 3/2006 | Li et al. .................. 438/785 |
| 2006/0180082 A1* | 8/2006 | Iwamoto et al. ........... 118/724 |

FOREIGN PATENT DOCUMENTS

| | | |
|---|---|---|
| JP | 2003-158262 | 5/2003 |
| JP | 2003-204061 | 7/2003 |
| JP | 2004-31760 | 1/2004 |
| JP | 2004-259906 | 9/2004 |
| JP | 2005-45166 | 2/2005 |
| JP | 2005-251785 | 9/2005 |
| JP | 2006-93670 | 4/2006 |
| WO | WO 2004/004014 A1 | 1/2004 |
| WO | WO2004/008544 A1 | 1/2004 |

OTHER PUBLICATIONS

Form PCT/ISA/237.
Form PCT/IB/338.
Form PCT/IB/373.

* cited by examiner

SEMICONDUCTOR DEVICE

TECHNICAL FIELD

The present invention relates to a semiconductor device. In particular, the present invention relates to a semiconductor device having a field effect transistor.

BACKGROUND ART

A MOSFET (Metal Oxide Semiconductor Field Effect Transistor) is known as a typical field effect transistors. A conventionally-known method for controlling a threshold voltage of a MOSFET is to adjust an amount of impurity (channel impurity) injected to a channel region. In recent years, the amount of channel impurity has been increased with increasing miniaturization of a device. This is essential for improving device performance based on the scaling law. To increase the amount of channel impurity is also necessary in a low power consumption device and the like that require a high threshold voltage.

However, the increase in the channel impurity causes decrease in a driving current due to impurity scattering, increase in a GIDL (Gate Induced Drain barrier Lowering) current, and increase in a substrate current when a substrate voltage is applied. That is to say, a device in which a large amount of impurity is injected into the channel region has such problems as the decrease in the driving current and the increase in the GIDL current. Furthermore, in a semiconductor device which actively utilizes the substrate bias effect, there is a problem that the substrate current is increased at the time when the substrate voltage is applied.

Therefore, methods have been proposed which control the threshold voltage without increasing the amount of channel impurity.

Japanese Laid-Open Patent Application No. JP-P2006-93670 (patent document D1) describes a method to control the threshold voltage by incorporating a metal element such as Hf at an interface between a gate electrode and a gate insulating film. More specifically, concentration of the metal element is changed in a range from not less than $1 \times 10^{13}$ atoms/cm$^2$ to less than $4 \times 10^{15}$ atoms/cm$^2$. Here, the metal element concentration means surface concentration of metal atoms when all the metal atoms included in the gate insulating film are gathered on one plane. The threshold voltage is controlled by changing the metal element concentration within the above-mentioned range. At this time, it is possible to reduce the amount of impurity in the channel region depending on the metal element concentration.

Another technique is described in a paper by Y. Shimamoto et al., "Advantages of gate work-function engineering by incorporating sub-monolayer Hf at SiON/poly-Si interface in low-power CMOS", 2005 Symposium on VLSI Technology Digest of Technical Papers, pp. 132-133. According to the technique, the threshold voltage is controlled and hence mobility is improved by incorporating Hf between a polysilicon gate electrode and a SiON gate insulating film. The threshold voltage depends not only on the amount of Hf but also on an amount of nitrogen included in the base SiON film. Therefore, a desired threshold voltage can be obtained by controlling the amount of nitrogen as well.

Meanwhile, there is also known a technique of using high-permittivity material to form a gate insulating film of a MOSFET. Typical high-permittivity material is exemplified by oxide which contains a metal element such as Zr, Hf, Al and La. By applying such the high-permittivity material to the gate insulating film of the MOSFET, it is possible to increase a physical thickness of the gate insulating film with keeping an electrical thickness thereof thin.

In order to improve electrical characteristics of the MOSFET, it is generally required to increase a MOS capacitance, i.e. to make the gate insulating film thinner. In that case, however, it is necessary to suppress increase in a leakage current accompanied by the thinning of the gate insulating film. In the case of the high-permittivity material gate insulating film, a desired MOS capacitance can be realized with a larger physical film thickness as compared with a case where a silicon oxide film is used as the gate insulating film. As a result, not only the electrical characteristics of the MOSFET are improved but also the gate leakage current is reduced as compared with the case of the silicon oxide film.

Japanese Laid-Open Patent Application No. JP-P2004-259906 (patent document D2) describes a gate insulating film that includes silicon, oxygen, nitrogen and metal. Respective concentrations of metal and nitrogen are highest at a central portion of the gate insulating film. On the other hand, concentration of silicon is highest on a surface side of the gate insulating film and on a silicon substrate interface side.

Japanese Laid-Open Patent Application No. JP-P2003-204061 (patent document D3) describes a gate insulating film that includes a silicon oxide film containing a metal element and nitrogen. A concentration distribution in a thickness direction of the metal element included in the silicon oxide film has a maximum value at a central portion of the silicon oxide film. A concentration distribution in the thickness direction of nitrogen included in the silicon oxide film has a maximum value at an interface between a gate electrode and the gate insulating film.

Japanese Laid-Open Patent Application No. JP-P2003-158262 (patent document D4) describes a gate insulating film that includes silicon, oxygen, nitrogen and a metal element. Concentration of the metal element in the gate insulating film is highest on an interface side between a gate electrode and the gate insulating film. On the other hand, concentration of nitrogen in the gate insulating film is highest on an interface side between the gate insulating film and a semiconductor substrate.

Japanese Laid-Open Patent Application No. JP-P2005-45166 (patent document D5) describes a gate insulating film that includes metal, silicon, oxygen and nitrogen. Concentration of nitrogen in the gate insulating film is maximum at an interface with respect to a gate electrode and minimum at an interface with respect to a silicon substrate. On the other hand, concentration of the metal in the gate insulating film is minimum at the interface with respect to the gate electrode and maximum at the interface with respect to the silicon substrate.

Japanese Laid-Open Patent Application No. JP-P2001-332547 (patent document D6) describes a gate insulating film consisting of a metal silicate layer. In the metal silicate layer, concentration of the constituent metal gradually decreases from an interface between a gate electrode and the metal silicate layer toward an interface between a silicon substrate and the metal silicate layer.

Japanese Laid-Open Patent Application No. JP-P2004-31760 (patent document D7) describes a gate insulating film made by introducing nitrogen into metal oxide or metal silicate. Concentration of nitrogen in the gate insulating film has a distribution in a film thickness direction. A position at which the nitrogen concentration takes a maximum value exists in a region away from a silicon substrate.

Japanese Laid-Open Patent Application No. JP-P2005-251785 (patent document D8) describes a semiconductor device in which nitrogen is selectively introduced into a high-permittivity insulating film in a depth direction.

DISCLOSURE OF INVENTION

The inventors of the present application have recognized the following points.

In the case of the structures described in the above-mentioned patent document D1 and paper, deterioration of breakdown voltage and deterioration of reliability occur. In the case of the laminate structure in which the metal material is sandwiched between the gate electrode and the gate insulating film, a high-permittivity thin film is formed due to oxidization of the metal material. As a result, a laminate structure of the high-permittivity thin film and a silicon oxide film (or silicon oxynitride film) is formed. In such the laminate structure, an electric field is locally applied to a side of the silicon oxide film (or silicon oxynitride film) having the lower permittivity. Consequently, the gate insulating film is likely to be broken-down, which leads to the deterioration of the breakdown voltage and the reliability.

In the case of the structures described in the above-mentioned patent documents D2, D3 and D5, it becomes difficult to make a film thinner. In the case of the structures in which the metal element concentration is low at the interface between the gate electrode and the high-permittivity gate insulating film, a layer with relatively low permittivity is formed in an upper part of the gate insulating film. Since the metal element concentration has a peak value at a position away from the gate electrode interface, the metal atoms come closer to the channel region with thinning the gate insulating film. As a result, the remote Coulomb scattering or the like caused by the metal atoms becomes conspicuous, which leads to decrease in the mobility. Since the deterioration of device characteristics becomes remarkable, it is difficult to make the insulating film thinner.

In the case of the structures described in the above-mentioned patent documents D3, D4 and D5, deterioration of breakdown voltage and deterioration of reliability occur. When a peak position of the metal element distribution and a peak position of the nitrogen distribution are different from each other in the gate insulating film, diffusion of the metal element can not be suppressed. In this case, an aggregation reaction of the metal element occurs during thermal processes, and thus a region of crystallized metal element appears in the gate insulating film. An electric field applied to such the gate insulating film becomes uneven. A region on which the electric field acts strongly is preferentially broken-down and thus the dielectric breakdown is accelerated.

In the case of the structure described in the above-mentioned patent document D4, the driving current becomes small. In the case where the distribution of nitrogen in the gate insulating film has the maximum value at the silicon substrate interface, the nitrogen atoms serve as fixed charges and thus cause scattering of carriers. As a result, the mobility is decreased and the driving current becomes small.

An object of the present invention is to provide a semiconductor device having a field effect transistor whose threshold voltage can be adjusted with a smaller amount of channel impurity than the conventional technique.

Another object of the present invention is to provide a semiconductor device having a field effect transistor with excellent interface electrical characteristics.

Still another object of the present invention is to provide a semiconductor device having a field effect transistor with excellent reliability.

According to the present invention, a semiconductor device having a field effect transistor is provided. The field effect transistor is provided with a gate insulating film formed on a semiconductor layer and a gate electrode formed on the gate insulating film. The gate insulating film has a silicon oxide film including a metal element and nitrogen. Respective distributions of the metal element and nitrogen in the gate insulating film have maximum values on an interface side between the gate insulating film and the gate electrode.

It is preferable that the distributions of the metal element and nitrogen in the gate insulating film decrease from the interface side between the gate insulating film and the gate electrode toward the semiconductor layer.

It is preferable that in the gate insulating film, a thickness of an insulating film having metal element composition not more than half of composition of the metal element at the interface between the gate insulating film and the gate electrode is 0.5 nm or more.

It is preferable that a width of the distribution of nitrogen in the gate insulating film is wider than a width of the distribution of the metal element in the gate insulating film.

It is preferable that when all atoms of the metal element included in the gate insulating film are gathered on a plane, the surface concentration of the metal atoms is not less than $3 \times 10^{13}$ atoms/cm$^2$ and not more than $1.5 \times 10^{14}$ atoms/cm$^2$.

It is preferable that a ratio of a total amount of nitrogen to a total amount of all elements constituting the gate insulating film is not less than 3 atomic % and not more and 15 atomic %. Or, it is preferable that when all atoms of nitrogen included in the gate insulating film are gathered on a plane, the surface concentration of the nitrogen atoms is not less than $5 \times 10^{14}$ atoms/cm$^2$ and not more than $5 \times 10^{15}$ atoms/cm$^2$.

The above-mentioned metal element is exemplified by Hf. Alternatively, the above-mentioned metal element may be Al or Zr.

According to the present invention, the respective distributions of the metal element and nitrogen in the gate insulating film have the peaks at the interface side between the gate insulating film and the gate electrode. Therefore, the carrier scattering due to the metal element and nitrogen at an interface between the gate insulating film and the semiconductor layer can be reduced. As a result, deterioration of electrical characteristics at the interface can be reduced. Moreover, since the distribution of the metal element has the maximum value at the interface side between the gate insulating film and the gate electrode, decrease in the mobility can be prevented even if the gate insulating film is made thinner. In other words, deterioration of device characteristics can be suppressed. Furthermore, since the distribution of the metal element and the distribution of nitrogen have the maximum values in the same region, diffusion of the metal element can be suppressed by the nitrogen. Therefore, an aggregation reaction of the metal element during thermal processes is suppressed, and thereby the occurrence of a region of crystallized metal element is prevented. As a result, local concentration of an electric field applied to the gate insulating film is prevented, and thus the gate insulating film with excellent reliability can be obtained.

According to the present invention, the threshold voltage of the field effect transistor is adjusted by controlling the concentrations and distributions of the metal element and nitrogen in the gate insulating film rather than the concentration of the channel impurity. More specifically, it is possible by controlling the concentrations and distributions of the metal element and nitrogen in the gate insulating film to obtain the field effect transistor with high mobility even if the gate insulating film is made thinner. Moreover, as described above, the field effect transistor having the excellent electrical characteristics and reliability can be obtained. According to the present invention, as described above, it is possible to form the field effect transistor having the excellent mobility, electrical characteristics and reliability with a small amount of the channel impurity.

BEST MODE FOR CARRYING OUT THE INVENTION

Figure 1A:
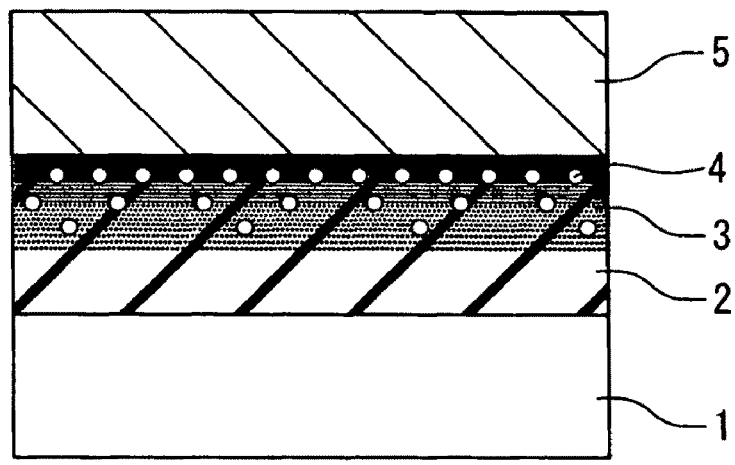
FIG. 1A is a cross-sectional view schematically showing a gate insulating film structure and its periphery in a semiconductor device according to an exemplary embodiment of the present invention.

With regard to a field effect transistor, the inventors of the present application have investigated distributions of a metal element and nitrogen included in a gate insulating film in detail by using an electron microscope. As a result, the inventors of the present application have found the following points. That is, a device having excellent mobility, reliability and electrical characteristics can be obtained in a case where respective concentration distributions of the metal element and nitrogen in the gate insulating film have peaks at an interface between a gate electrode and the gate insulating film and the distributions gradually decrease toward a semiconductor substrate. The present invention is based upon such the knowledge discovered by the inventors of the present application.

A semiconductor device according to an exemplary embodiment of the present invention will be described below with reference to the attached drawings. In the attached drawings, the same reference numerals are given to the same components and an overlapping description will be omitted as appropriate. The semiconductor device according to the present exemplary embodiment is provided with a field effect transistor having the above-mentioned characteristics.

1. Structure and Manufacturing Method of Gate Insulating Film

FIG. 1A is a cross-sectional view schematically showing a gate insulating film structure and its periphery in the semiconductor device according to the present exemplary embodiment. In FIG. 1A, a gate insulating film 2 is formed on a silicon substrate 1 that is a semiconductor layer. The gate insulating film 2 has a silicon oxide film. The gate insulating film (silicon oxide film) 2 according to the present exemplary embodiment includes nitrogen 3 and hafnium (Hf) 4 that is a metal element. Characteristics of the silicon oxide film 2 as the gate insulating film are modified by adding the metal element 4 and the nitrogen 3. A polysilicon gate electrode 5 is formed on the gate insulating film 2.

Figure 2A:
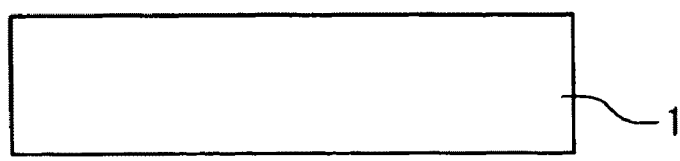
FIG. 2A is a cross-sectional view showing an example of a process of manufacturing the structure shown in FIG. 1A.
Figure 2B:
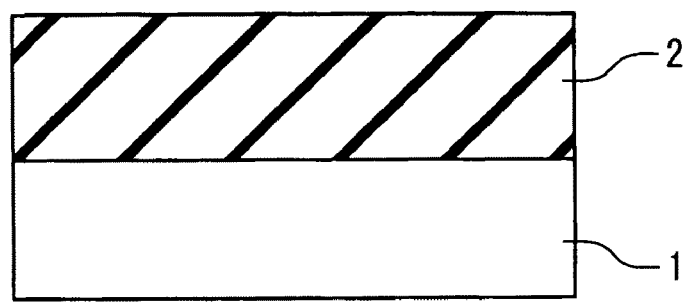
FIG. 2B is a cross-sectional view showing the example of the process of manufacturing the structure shown in FIG. 1A.
Figure 2C:
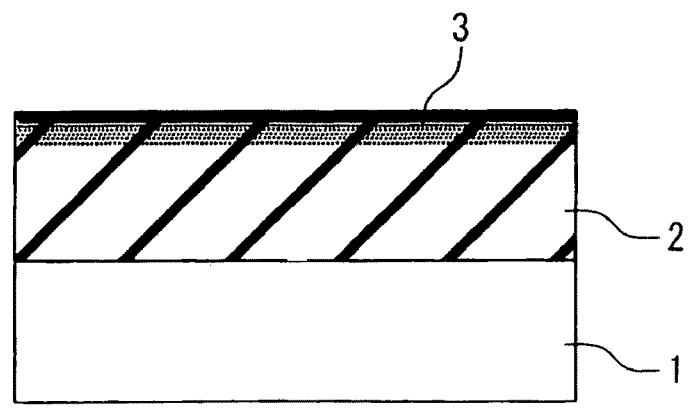
FIG. 2C is a cross-sectional view showing the example of the process of manufacturing the structure shown in FIG. 1A.
Figure 2D:
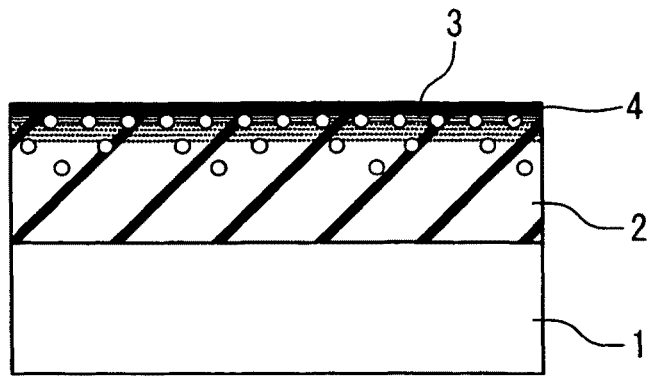
FIG. 2D is a cross-sectional view showing the example of the process of manufacturing the structure shown in FIG. 1A.
Figure 2E:
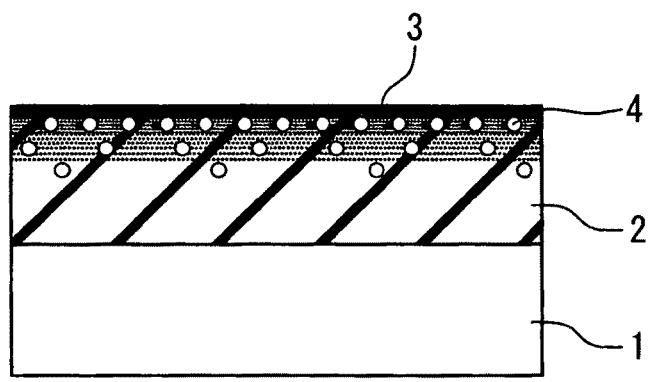
FIG. 2E is a cross-sectional view showing the example of the process of manufacturing the structure shown in FIG. 1A.
Figure 2F:
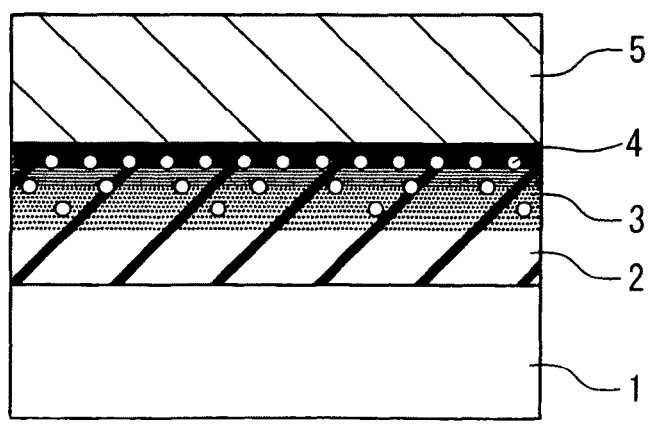
FIG. 2F is a cross-sectional view showing the example of the process of manufacturing the structure shown in FIG. 1A.

FIGS. 2A to 2F show an example of a process of manufacturing the structure shown in FIG. 1A. First, as shown in FIG. 2A, the silicon substrate 1 as a semiconductor layer is provided. Next, the silicon oxide film 2 is formed on the silicon substrate 1 as shown in FIG. 2B. Next, nitriding is performed with respect to the silicon oxide film 2 based on a plasma nitriding method. As a result, nitrogen 3 is introduced into the silicon oxide film 2 (a silicon oxynitride film is formed), as shown in FIG. 2C. Next, Hf 4 is deposited on the silicon oxide film 2 based on a sputtering method. After that, thermal nitriding is further performed. Consequently, as shown in FIGS. 2D to 2F, nitrogen concentration is increased on the surface side of the silicon oxide film 2, while the Hf atoms 4 are thermally diffused so as to have a gradual distribution in the silicon oxide film 2. Lastly, as shown in FIG. 2F, the polysilicon gate electrode 5 is formed on the silicon oxide film (gate insulating film) 2 including the nitrogen 3 and the Hf 4.

Figure 1B:
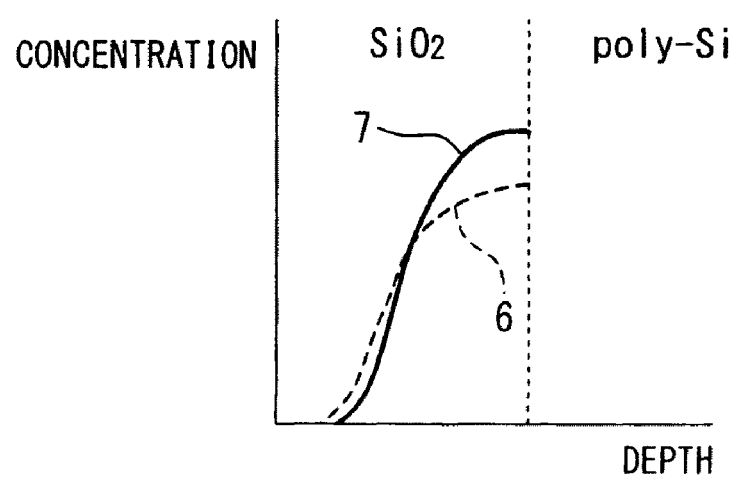
FIG. 1B is a graph showing respective distributions of nitrogen and Hf element included in the gate insulating film structure shown in FIG. 1A.

FIG. 1B shows respective distributions of nitrogen 3 and Hf 4 included in the gate insulating film 2. In FIG. 1B, the distribution of nitrogen 3 is indicated by a curve 6 while the distribution of Hf 4 is indicated by a curve 7. As shown in FIG. 1B, nitrogen 3 and Hf 4 are localized near a surface of the silicon oxide film 2 on a side of the polysilicon gate electrode 5. In other words, peaks of the respective distributions of nitrogen 3 and Hf 4 exist on the gate electrode/gate insulating film interface side. The nitrogen atoms and the Hf atoms can be scattering factors of carriers. Since nitrogen 3 and Hf 4 are distributed mainly in a region away from a gate insulating film/silicon substrate interface, the scattering of carriers at the interface is suppressed. That is to say, it is possible to fabricate a device having high mobility.

Moreover, it is preferable that the distributions of nitrogen 3 and Hf 4 are high on the gate electrode/gate insulating film interface side and gradually decrease toward the silicon substrate 1 as the semiconductor layer, as shown in FIG. 1B. In this case, it is possible to reduce local concentration of an electric filed applied to the gate insulating film 2. As a result, it is possible to fabricate a device having excellent reliability and electrical characteristics.

Furthermore, it is preferable that a width of the distribution of nitrogen 3 (curve 6) is wider than a width of the distribution of Hf 4 (curve 7) in the gate insulating film 2, as shown in FIG. 1B. In this case, it is possible to suppress diffusion of Hf 4 in a direction toward the gate insulating film/silicon substrate interface during a heat treatment. Therefore, deterioration of mobility caused by Hf 4 can be suppressed.

Furthermore, since nitrogen 3 and Hf 4 have peaks in the same region according to the above-mentioned structure, it is also possible to suppress diffusion of Hf 4 in a direction parallel to the gate electrode/gate insulating film interface. It is thus possible to suppress aggregation reaction namely crystallization reaction of Hf 4 in the heat treatment. As a result, the occurrence of unevenness in the gate insulating film 2 is prevented, and thus local concentration of an electric field applied to the gate insulating film 2 can be reduced. Consequently, it is possible to fabricate a device having excellent reliability and electrical characteristics.

In the above-mentioned structure, the concentration of Hf 4 is preferably set to be in a range not less than $3 \times 10^{13}$ atoms/cm$^2$ and not more than $1.5 \times 10^{14}$ atoms/cm$^2$. Here, the Hf concentration is defined by a surface concentration of the Hf atoms when all the Hf atoms included in the gate insulating film 2 are gathered on one plane. It is possible to control a threshold voltage of a CMOSFET (Complementary Metal Oxide Semiconductor Field Effect Transistor) by adjusting the concentration of Hf 4. It is also possible to improve the mobility by setting the concentration of Hf 4 within the above-mentioned range. The reason is explained below.

Figure 12:
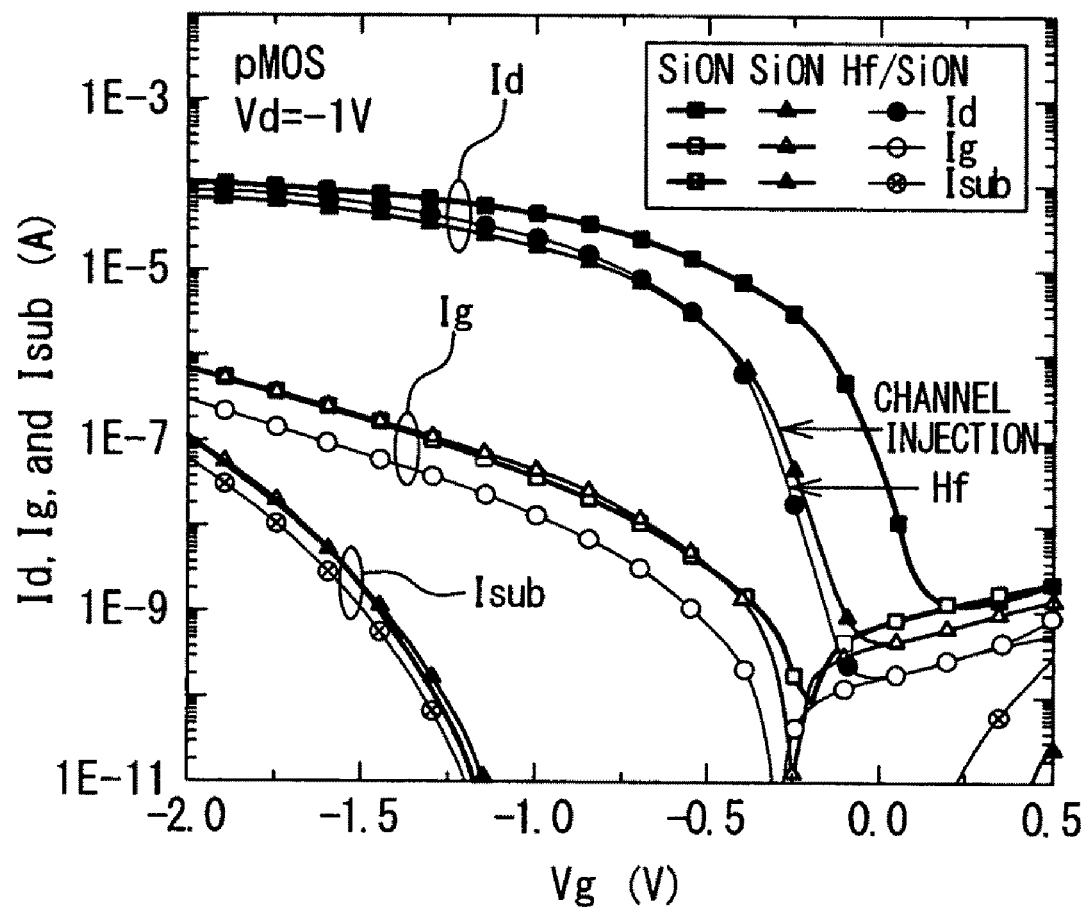
FIG. 12 is a graph showing an Id (Ig)-Vg characteristic of a PMOS transistor according to the present exemplary embodiment.

The threshold voltage is determined by the amount of impurity injected into the channel region as well as the concentration of Hf 4 and the amount of nitrogen 3 introduced into the gate insulating film 2. In general, the mobility is improved with decrease in the amount of impurity injected into the channel region. FIG. 12 shows an Id (Ig)-Vg characteristic of a PMOS transistor that was produced experimentally. More specifically, two kinds of processing were performed with respect to a non-channel-impurity-injected SiON gate insulating film in order to shift the threshold voltage by about 300 mV in the minus direction, and then a comparison was made. On the one hand, arsenic in a concentration of $1.5 \times 10^{14}$ atoms/cm$^2$ was injected into the channel region. On the other hand, Hf was formed with a concentration of $1.8 \times 10^{14}$ atoms/cm$^2$ on the SiON gate insulating film. In can be seen from FIG. 12 that better characteristics are obtained with regard to a driving current, an off current, a leakage current (Ig) and an S value when the threshold voltage is shifted by using Hf.

Figure 13:
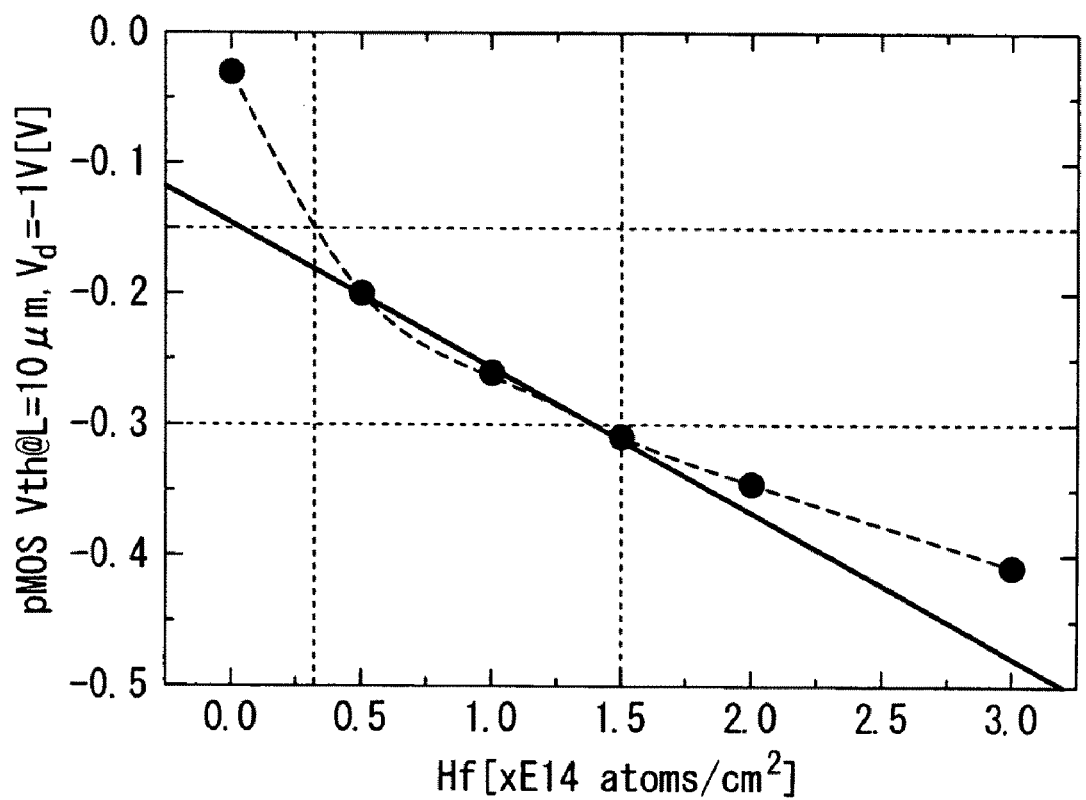
FIG. 13 is a graph showing a relationship between a threshold voltage of the PMOS transistor and an Hf deposition amount according to the present exemplary embodiment.

In order to obtain such a merit, the threshold voltage of the PMOS transistor needs to be controlled in a rage from −150 to −300 mV. The reason is that if the threshold voltage does not reach −150 mV, the channel injection amount on the NMOS side cannot be decreased and thus the improvement effect of the mobility cannot be obtained. Also, if the threshold voltage exceeds −300 mV, too large variation deteriorates a balance with a threshold voltage on the NMOS side, which causes deterioration of characteristics of the CMOSFET as a whole. FIG. 13 shows variations of the threshold voltage of the PMOS with respect to an Hf deposition amount. It can be seen from FIG. 13 that the Hf deposition amount for obtaining the desired threshold voltage (−150 to −300 mV) is in the range not less than $3 \times 10^{13}$ atoms/cm$^2$ and not more than $1.5 \times 10^{14}$ atoms/cm$^2$ as described above. By controlling the threshold voltage within the range, it is possible to enjoy the improvement effect of the device characteristics shown in FIG. 12.

The above-mentioned concentration of Hf in the gate insulating film 2 can easily be obtained by employing a measurement using X-ray. For example, an XRF (X-ray Fluorescence) measurement or a TREX (Total Reflection X-ray Fluorescence) measurement is employed. The Hf concentration in the gate insulating film 2 can be obtained by irradiating a surface of a sample including Hf with X-ray and detecting its reflected light.

Moreover, in the above-mentioned structure, the concentration of nitrogen 3 is preferably set to be in a range not less than 3 atomic % and not more than 15 atomic % (from $5 \times 10^{14}$ atoms/cm$^2$ to $5 \times 10^{15}$ atoms/cm$^2$). Here, the nitrogen concentration is defined by a ratio of a total amount of the nitrogen to a total amount of all the elements constituting the gate insulating film 2. Alternatively, the nitrogen concentration is defined by a surface concentration of the nitrogen atoms when all the nitrogen atoms included in the gate insulating film 2 are gathered on one plane. Due to the above setting, diffusion of Hf 4 to the substrate interface can be suppressed and diffusion of nitrogen 3 to the substrate interface can be suppressed. As described above, the Hf atoms and the nitrogen atoms act as the scattering factors of carriers.

The nitrogen 3 brings about an effect of suppressing the diffusion of Hf 4. In order to enjoy the effect, it is preferable that the nitrogen concentration is within the above-mentioned range. If the nitrogen concentration is less than 3 atomic %, it is not possible to suppress the diffusion of Hf 4 in the gate insulating film 2 during, for example, a heat treatment for activating a source and a drain. In that case, Hf 4 diffuses toward the gate insulating film/silicon substrate interface and acts as the scattering factor of electrons, which deteriorates the mobility. Also, if the nitrogen concentration is less than 3 atomic %, the aggregation and crystallization of Hf 4 are caused by the diffusion of Hf 4 in the gate insulating film 2. As a result of unevenness occurring in the gate insulating film 2, a region on which an electric field acts strongly is preferentially broken-down and thus the reliability is deteriorated. On the other hand, if the nitrogen concentration exceeds 15 atomic %, nitrogen 3 in the gate insulating film 2 reaches the gate insulating film/substrate interface. As a result, the nitrogen 3 acts as the scattering factor of electrons and thus the mobility is deteriorated.

The above-mentioned concentration of nitrogen in the gate insulating film 2 can easily be obtained by employing a measurement using X-ray. For example, an XPS (X-ray Photoelectron Spectroscopy) measurement is employed. The nitrogen concentration in the gate insulating film 2 can be obtained by irradiating a surface of a nitriding-processed sample with X-ray and detecting and analyzing its reflected light.

Furthermore, it is preferable that in the gate insulating film 2, a thickness of an insulating film having Hf composition not more than the half of Hf composition at the gate electrode/gate insulating film interface is 0.5 nm or more. The distribution of the Hf concentration in the gate insulating film 2 is preferably set in that manner. Consequently, it is possible to fabricate a device with less deterioration of the mobility. A relationship between the electron mobility and the thickness of the insulating film having Hf composition not more than the half of Hf composition at the gate electrode/gate insulating film interface was examined in detail. As a result, it was found that the level of scattering of electrons running in the channel by Hf becomes high in a case where the thickness of the insulating film having Hf composition not more than the half of Hf composition at the gate electrode/gate insulating film interface is smaller than 0.5 nm. In this case, the electron mobility is significantly deteriorated.

The case where Hf is used as the metal element has been explained above as an example. According to the present invention, Al or Zr may also be used as the metal element. In either case, similar effects can be obtained. It should be noted that the concentrations of the metal element and nitrogen in the gate insulating film 2 can also be measured by using an analysis method such as EELS (Electron Energy Loss Spectroscopy) and SIMS (Secondary Ion Mass Spectroscopy), for example.

2. Addition of Metal Element

Explained next will be an apparatus to add the metal element and a process of adding the metal element for realizing the structure according to the present exemplary embodiment. Here, the case where Hf is added as the metal element will be explained as an example.

Figure 3:
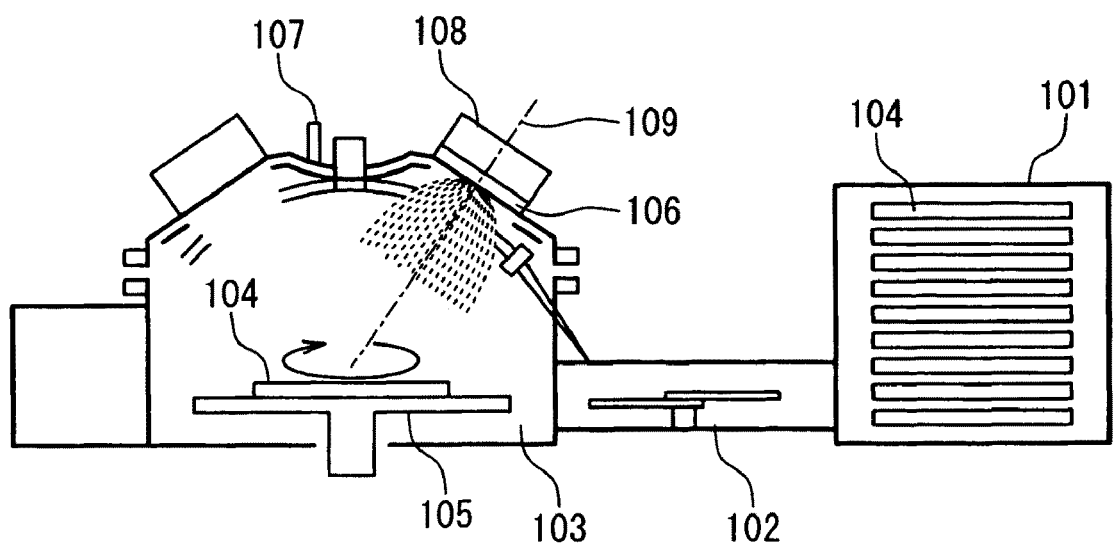
FIG. 3 is a schematic diagram showing an example of a metal element addition apparatus according to the present exemplary embodiment.

FIG. 3 is a schematic diagram showing an example of a metal element addition apparatus according to the present exemplary embodiment. Usually, the apparatus shown in FIG. 3 is called a PVD (Plasma Vapor Deposition) apparatus. The PVD apparatus for use in adding the metal element is provided with an exchange chamber 101, a transport robot chamber 102 and a sample processing chamber 103. A plurality of wafers 104 can be stored in the exchange chamber 101. Each chamber is provided with a vacuum pumping system, and it is thereby possible to transport the wafers in a vacuum. The sample processing chamber 103 is provided with a wafer stage 105, an Hf target 106, an argon gas introduction line 107 and a plasma source 108. Plasma is generated in an argon gas atmosphere. Then, argon atoms sputter Hf and thereby the Hf is deposited on the wafer. The wafer stage 105, which is so arranged as to be inclined from a central line 109 of the Hf target 106, can be rotated during the deposition. Consequently, excellent in-plane uniformity can be achieved.

By using the PVD apparatus thus constructed, it is possible to deposit an extremely small amount of Hf with high controllability. More specifically, an argon flow rate was set to 100 sccm, chamber pressure was set to 0.102 Pa, and microwave intensity was set to 15 W. By employing such the process condition, electron temperature in the plasma can be lowered and controllability of the Hf deposition amount can be improved.

Figure 4:
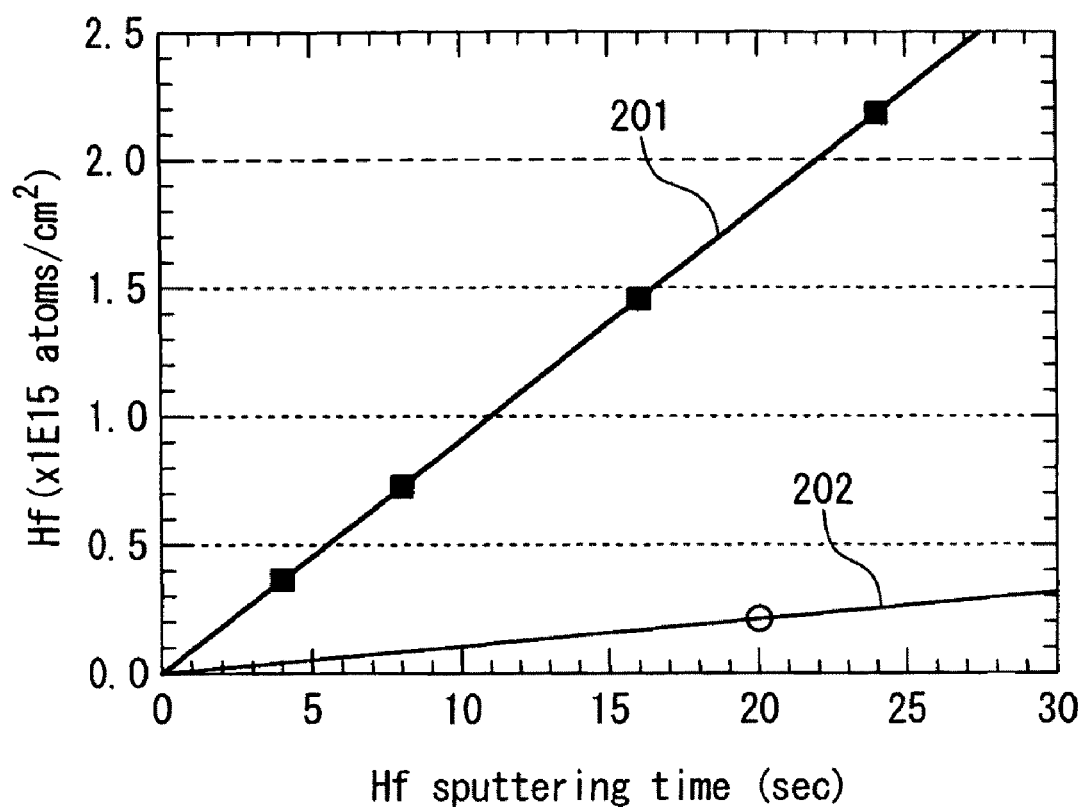
FIG. 4 is a graph showing a relationship between an Hf deposition amount and a processing time.
Figure 5:
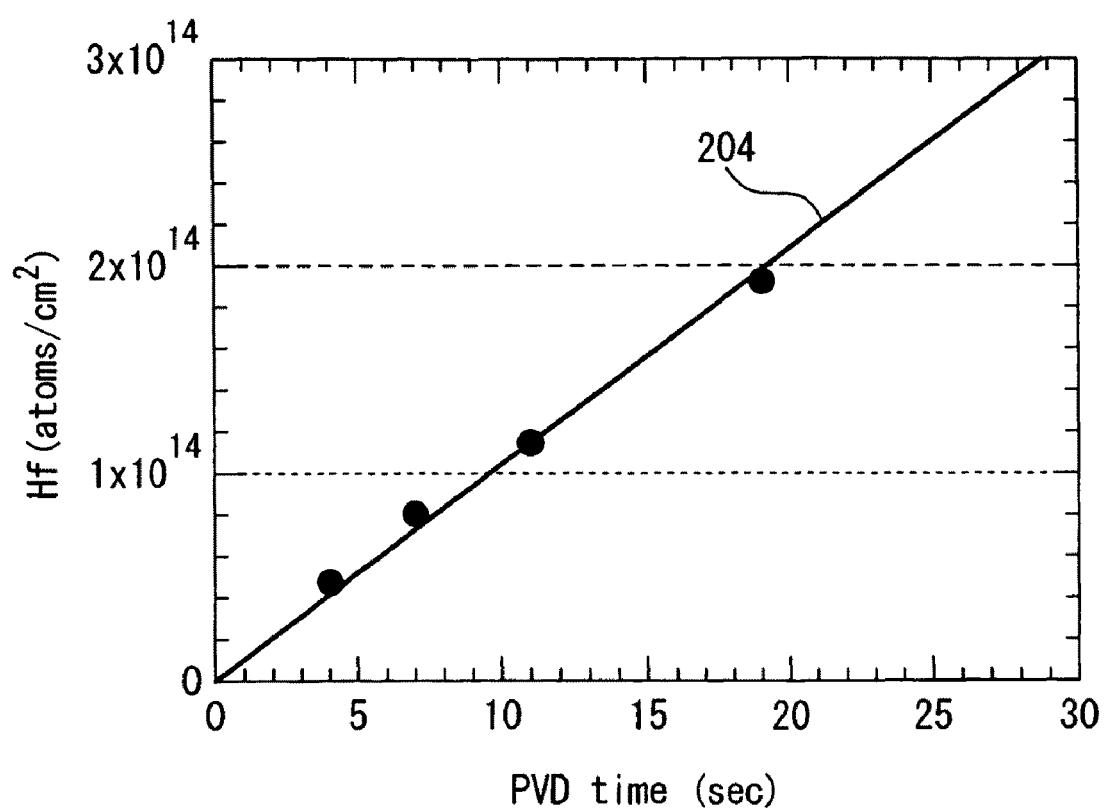
FIG. 5 is a graph showing a relationship between an Hf deposition amount and a processing time.

FIGS. 4 and 5 are graphs showing the Hf controllability in the present exemplary embodiment, where a relationship between the Hf deposition amount and processing time is shown. A longitudinal axis indicates the Hf deposition amount, and an abscissa axis indicates the processing time. Here, the Hf deposition amount is obtained by the XRF measurement or the TREX measurement.

FIG. 4 shows a deposition time dependence of the Hf deposition amount under the above-mentioned process condition (a line 202). Moreover, a deposition time dependence of the Hf deposition amount under another process condition (argon flow rate: 20 sccm, chamber pressure: less than 0.1 Pa, microwave intensity: 100 W) is also shown as a comparative example in FIG. 4 (a line 201). It can be seen from FIG. 4 that the Hf deposition amount with respect to the time is decreased by using the process condition according to the present exemplary embodiment (argon flow rate: 100 sccm, microwave intensity: 15 W). That is to say, it is possible according to the present exemplary embodiment to deposit a small amount of Hf with high controllability.

FIG. 5 (a line 204) shows a result obtained by examining in detail the Hf deposition amount associated with the process condition according to the present exemplary embodiment (argon flow rate: 100 sccm, microwave intensity: 15 W). It can be seen from FIG. 5 that Hf can be added with a high degree of accuracy in a region not less than $3 \times 10^{13}$ atoms/cm$^2$ and not more than $1.5 \times 10^{14}$ atoms/cm$^2$. It should be noted that "×10$^x$" may be expressed by "×1Ex" or "xEx" in each drawing. For example, "×10$^{15}$" is expressed by "×1E15" in FIG. 4.

Figure 6A:
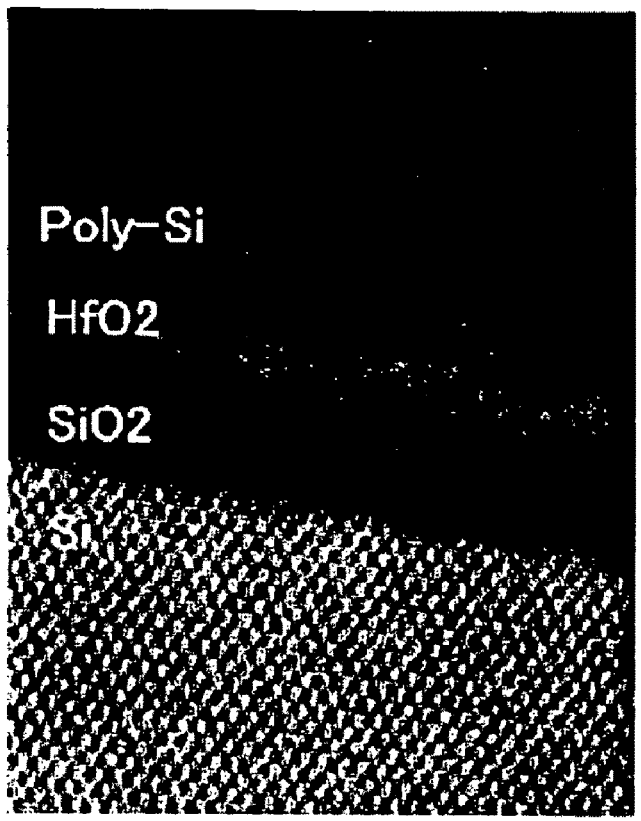
FIG. 6A is a STEM cross-sectional observation image of an $HfO_2/SiO_2$ sample.
Figure 6B:
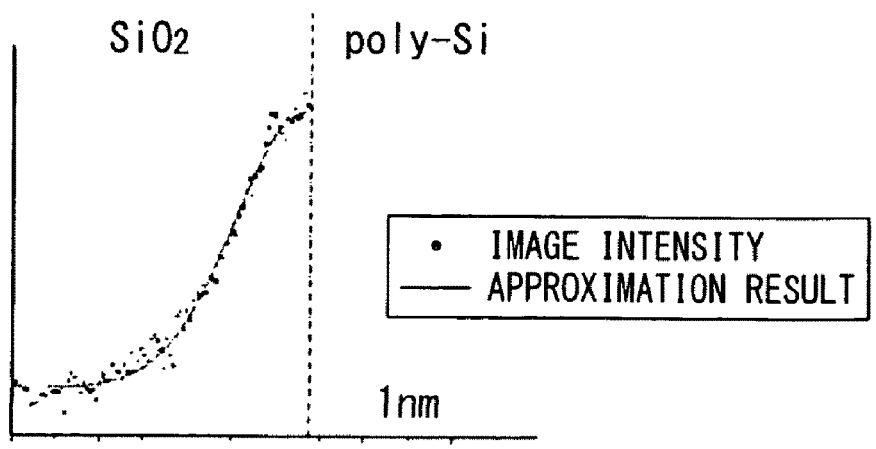
FIG. 6B is a graph showing an Hf distribution in a depth direction in the $HfO_2/SiO_2$ sample.

With regard to the Hf thus added, a distribution in a depth direction in the silicon oxide film (SiO$_2$ film) was observed. More specifically, a cross-section of an HfO$_2$/SiO$_2$ sample was observed with the use of a STEM (Scanning Transmission Electron Microscopy). FIG. 6A illustrates a cross-sectional observation image obtained by the STEM. The cross-sectional observation image is called a high-angle annular dark-field image, and intensity of the image is in proportion to composition of a heavy element (Hf in the present example) included in the sample. FIG. 6B shows an intensity distribution of the cross-sectional observation image along a film thickness direction (direction vertical to the surface of the substrate), namely, the distribution of Hf in the depth direction. As shown in FIG. 6B, the concentration distribution of Hf has a peak at a surface of the SiO$_2$ layer and gradually decreases toward the silicon substrate.

Figure 7A:
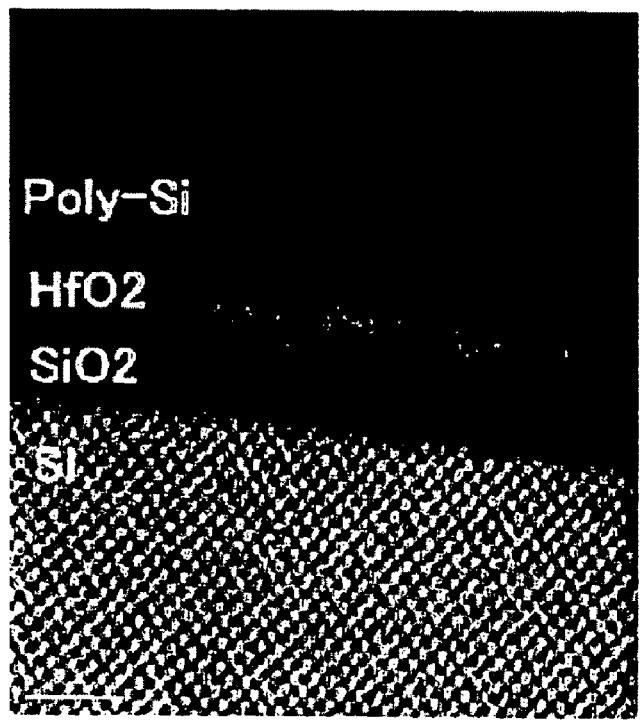
FIG. 7A shows a STEM cross-sectional observation image of an $HfO_2/SiON$ sample.
Figure 7B:
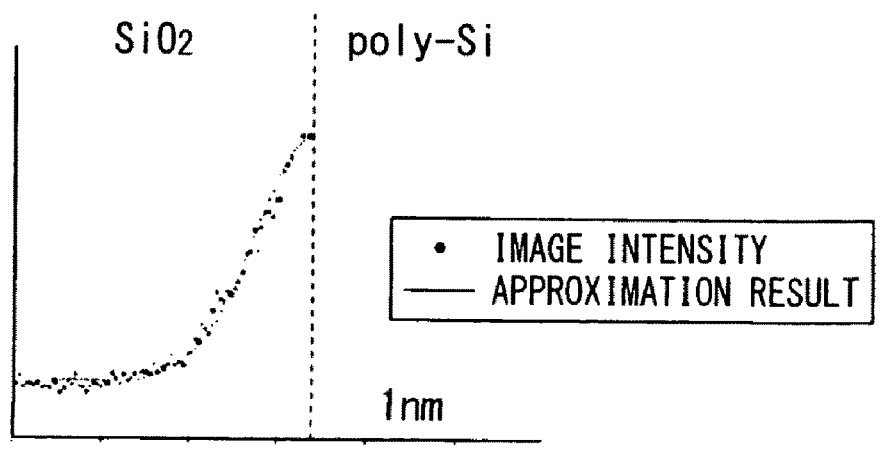
FIG. 7B is a graph showing an Hf distribution in a depth direction in the $HfO_2/SiON$ sample.

An example of a method to control a width of the Hf distribution in the depth direction will be described below. More specifically, with regard to the above-mentioned sample, nitrogen (N) was added to the SiO$_2$ film before the Hf was added. The added amount of nitrogen is 5%. A sample was formed by the same process as in the case of FIGS. 6A and 6B except for the addition of nitrogen. FIG. 7A shows a cross-sectional observation image of the HfO$_2$/SiON sample obtained by the STEM. FIG. 7B shows an intensity distribution of the cross-sectional observation image along the film thickness direction, namely, the distribution of Hf in the depth direction. As shown in FIG. 7B, the distribution width of Hf is narrowed as compared with the case of FIG. 6B.

More specifically, the respective intensity distribution curves shown in FIG. 6B and FIG. 7B were approximated by a normal distribution function, and then respective parameters indicating the distribution widths were calculated. When an argument of an exponential section of the normal distribution function is expressed as "$-2 (x^2/W^2)$", the W is the parameter. Here, the variable x indicates a distance in the film thickness direction of the gate insulating film when the origin is the interface between the gate electrode and the gate insulating film. The calculated parameters were 0.73 and 0.48 with regard to FIG. 6B and FIG. 7B, respectively. This means that the width of the Hf distribution in the depth direction can be controlled to be small by adding nitrogen to the SiO$_2$ film.

Further, the inventors of the present application removed the Hf-added SiO$_2$ film by an etching, and measured a surface concentration of Hf (residual Hf amount) on the surface of the exposed silicon substrate. As a result, the inventors of the present application found that there is a clear correlation between the above-mentioned distribution width in the depth direction of Hf in the SiO$_2$ film and the surface concentration of Hf on the silicon substrate surface. That is to say, it was revealed that the surface concentration of Hf measured at the silicon substrate surface is increased as the distribution width of Hf in the depth direction becomes larger.

Figure 8:
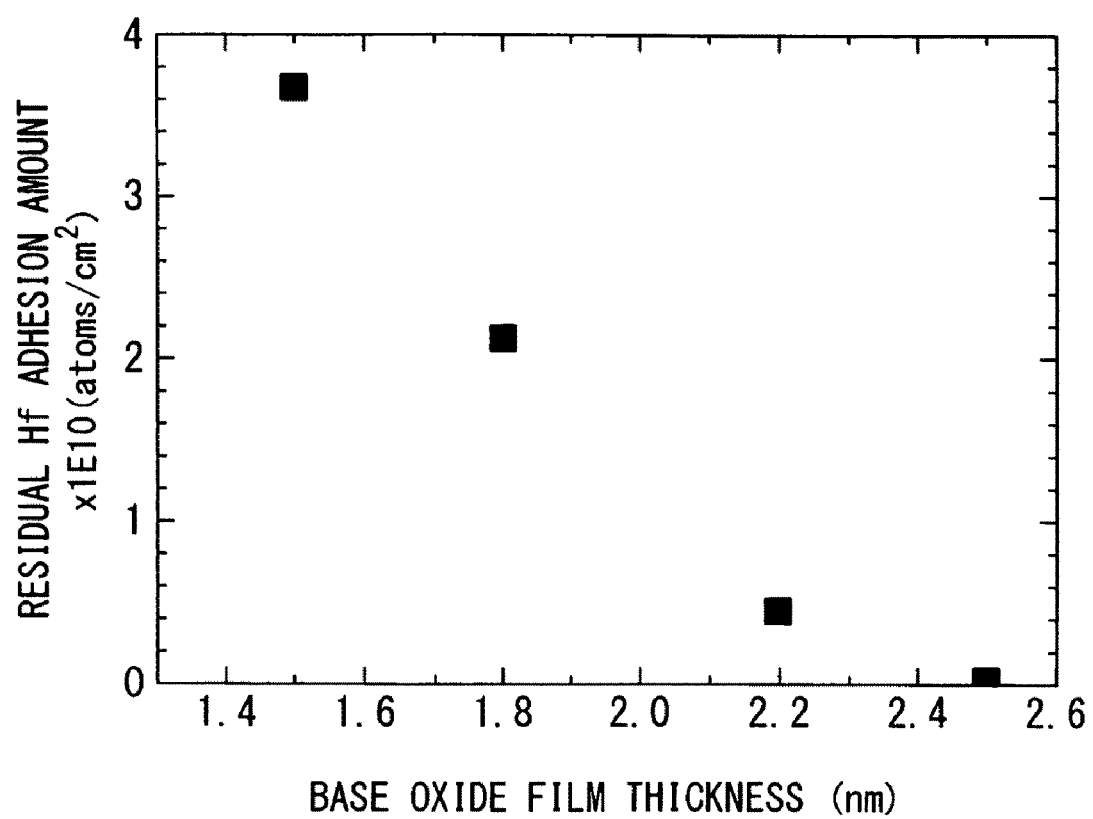
FIG. 8 is a graph showing a relationship between an Hf amount at a surface of a silicon substrate and a thickness of a base oxide film.

FIG. 8 is a graph showing an example of the correlation. FIG. 8 shows a relationship between the Hf amount at the surface of the silicon substrate and the thickness of the base oxide film. The thickness of the SiO$_2$ film was changed to various values while the added amount of Hf was kept constant. The surface concentration of Hf on the silicon substrate surface at that time was measured by the TREX method. It can be seen from FIG. 8 that the detected amount of Hf is increased as the thickness of the SiO$_2$ film becomes small. That is to say, the Hf amount detected on the surface of the silicon substrate becomes larger as the Hf distribution in the SiO$_2$ film expands to a region closer to the silicon substrate. This indicates that there is a positive correlation between the distribution width of Hf in the depth direction and the surface concentration of Hf on the silicon substrate surface.

Furthermore, the inventors of the present application repeated the measurement of the Hf amount on the silicon substrate surface with regard to samples fabricated under various conditions. Through the measurements, the inventors of the present application found that the Hf distribution in the depth direction in a thin film can be controlled by variously changing the condition under which the thin film is formed. Some examples are shown below.

Figure 9A:
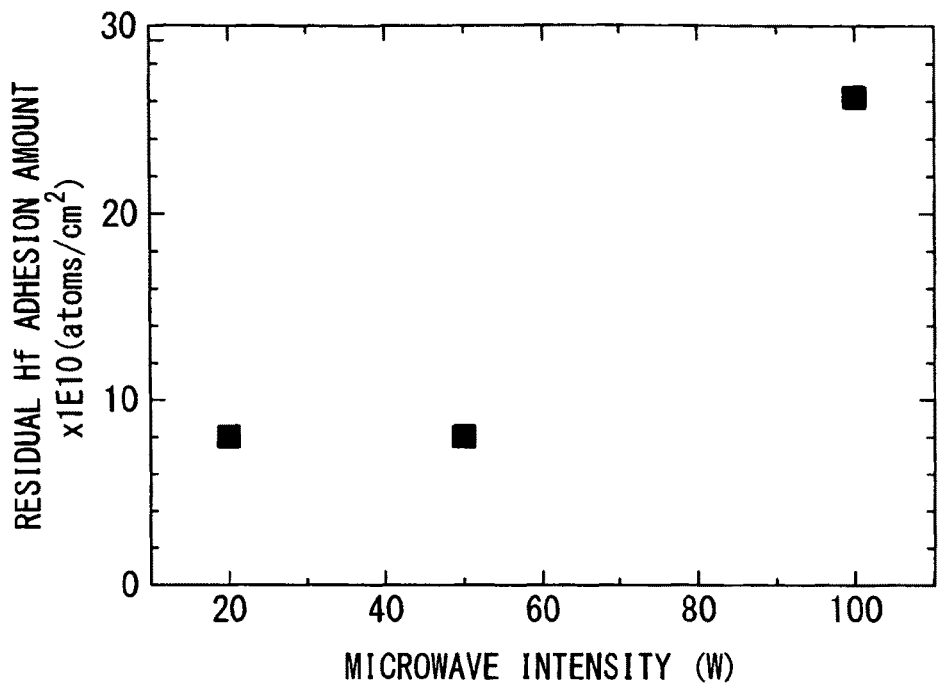
FIG. 9A is a graph showing a relationship between an Hf amount at a surface of a silicon substrate and microwave intensity.

FIG. 9A shows a relationship between the microwave intensity at the time of the Hf addition and the Hf amount on the silicon substrate surface. It should be noted here that the Hf amount deposited by the PVD method is set constant. It can be seen from FIG. 9A that the Hf amount detected on the silicon substrate surface becomes large in a case where the microwave intensity is 100 W as compared with the other cases (20 W, 50 W). This indicates that a diffusion depth of Hf into the base insulating film depends on the microwave intensity.

Figure 9B:
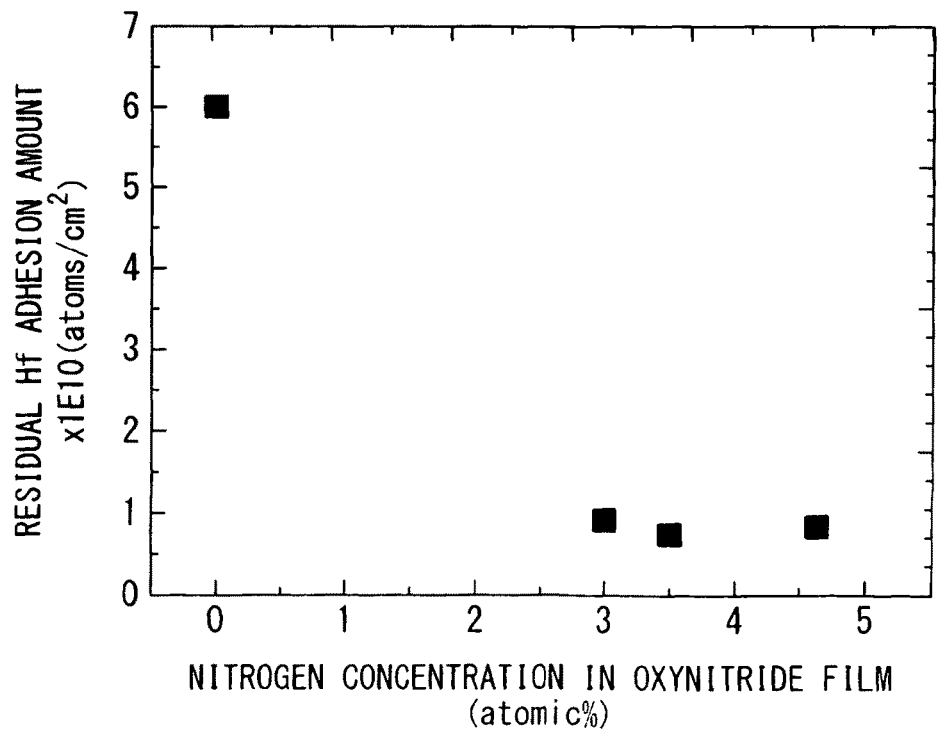
FIG. 9B is a graph showing a relationship between an Hf amount at a surface of a silicon substrate and nitrogen concentration in a base insulating film.

FIG. 9B shows a relationship between the nitrogen concentration in the insulating film and the Hf amount on the silicon substrate surface. It can be seen from FIG. 9B that the residual Hf amount is reduced remarkably when the nitrogen concentration is not less than 3 atomic %. This result is consistent with the foregoing result shown in FIG. 7B. That is to say, it is possible to control the width of the Hf distribution in the depth direction to be small by adding nitrogen to the SiO$_2$ film. It can be also seen from FIG. 9B that a sufficient effect to suppress the Hf diffusion can be obtained even with the nitrogen concentration of about 3 atomic %.

It should be noted that an AL-CVD (Atomic Layer Chemical Vapor Deposition) method can also be employed for fabricating the above-described gate insulating film structure. For example, TEMAH (Tetrakis Ethylmethylamino Hafnium) including Hf and gas 3DMAS (Tris Dimethyl Amino Silane) including silicon are used as material gases. Also, O3 is used as oxidant. An HfSiO film can be formed layer-by-layer by alternately supplying the material gases and the oxidant. According to the AL-CVD method, it is possible to control the above-mentioned Hf concentration by reducing the number of cycles of the alternate supply. After Hf is deposited, a heat treatment is performed in accordance with the nitrogen amount in the base insulating film. Thus, the gate insulating film structure according to the present exemplary embodiment can be fabricated easily.

The method of adding the metal element to the SiO$_2$ film has been described above. Moreover, it has been described that the distribution of the metal element can be controlled by adding nitrogen to the SiO$_2$ film. Furthermore, the distribution in the depth direction of the metal element in the formed gate insulating film has been described. According to the present exemplary embodiment, it is possible to add an extremely low concentration of Hf. More specifically, the surface concentration of the added Hf can be controlled in the range not less than $3 \times 10^{13}$ atoms/cm$^2$ and not more than $1.5 \times 10^{14}$ atoms/cm$^2$. The distribution of Hf takes the maximum value on the gate electrode/gate insulating film interface side and decreases toward the semiconductor layer side.

3. Suppression of Compositional Separation

Explained next will be suppression of compositional separation in the silicon oxide film to which the metal element is added. Here, the case where Hf is added as the metal element will be explained as an example.

According to the present exemplary embodiment, a distribution region of nitrogen in the depth direction is set to be at least equivalent to a distribution region of the metal element in the depth direction in order to suppress the compositional separation in the silicon oxide film to which the metal element is added. In other words, a structure in which Si, oxygen and nitrogen are present simultaneously is formed at least in a region where Hf is present. The fact that such the structure effectively suppresses the compositional separation will be explained below. For that purpose, a relationship between composition of an $Hf_xSi_{1-x}O_yN_z$ thin film and occurrence of the compositional separation will be demonstrated. Here, whether the compositional separation occurs or not is judged by focusing attention on formation of crystal grain of metal oxide that is generated accompanied by the compositional separation. A crystallization temperature of the metal oxide is very low (about 500 degrees in general), and the formation of crystal grain of the metal oxide can be used as a synonym for the occurrence of the compositional separation.

Figure 10:
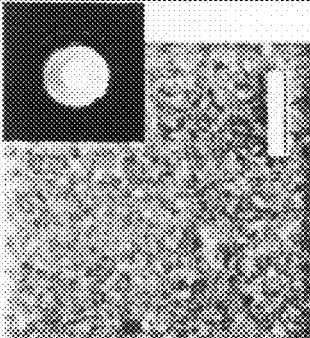
FIG. 10 shows plane-view TEM observation images of $Hf_xSi_{1-x}O_yN_z$ thin film samples.

FIG. 10 shows plane-view TEM observation images of respective $Hf_xSi_{1-x}O_yN_z$ thin film samples having various compositions. The compositions of the respective samples (Samples A1 to A6) are as shown in the following table.

TABLE 1

| Sample No | Hf comp. [Hf]/[Si + Hf] | N comp. (atomic %) |
|---|---|---|
| A1 | 100% | 0% |
| A2 | 100% | 25% |
| A3 | 70% | 0% |
| A4 | 70% | 20% |
| A5 | 55% | 0% |
| A6 | 55% | 15% |

In the above table, the Hf composition is expressed as a ratio of an atomic concentration of Hf to an atomic concentration of all the metal elements included in the gate insulating film. The N composition is expressed as a ratio of an atomic concentration of N to the number of all atoms included in the gate insulating film. A heat treatment at 1000 degrees was performed with respect to every sample. In FIG. 10, the upper stage shows TEM observation images of the samples (A1, A3 and A5) which do not include N, while the lower stage shows TEM observation images of the samples (A2, A4 and A6) which include N. In the respective TEM observation images, some crystal regions having specific crystal orientations are observed brightly. A region that is observed darkly corresponds to a crystal region having a crystal orientation different from that of the crystal region that is observed brightly, or a (amorphous) region which does not have periodic atomic geometry.

With regard to the samples A1 and A2 (Si: 0%), it is obvious that crystal grains are formed in both of the samples. Also, a position of a diffraction ring indicates that the formed crystal grains are $HfO_2$. It is obvious from these results that the effect of suppressing the crystallization of $HfO_2$ in the annealing at 1000 degrees cannot be obtained even when N is added to $HfO_2$.

Next, it can be seen from a comparison between the sample A1 (Si: 0%) and the sample A3 (Si: 30%) that a size of the crystal grain formed becomes smaller as the Hf concentration decreases. It should be noted that the formation of crystal grains is still observed even in the sample A5 (Si: 45%) and a position of a diffraction ring indicates that the crystal grains are $HfO_2$. It is obvious from these results that the compositional separation of $HfO_2$ basically occurs in the gate insulating film that does not include N and is formed of Hf, Si and oxygen.

On the other hand, crystal grains are not observed in the sample A4 (Si: 30%, N: 20%) and the sample A6 (Si: 45%, N: 15%) that include Hf, Si, oxygen and nitrogen simultaneously. Moreover, the diffraction patterns of those samples do not show clear diffraction spots and diffraction ring which are observed in the other samples. This indicates that the thin films of the samples A4 and A6 basically have an amorphous structure. The followings are found from these results. That is, to add N to a region including at least Hf is effective for suppressing the compositional separation of $HfO_2$ in the silicon oxide film to which Hf is added.

The reason why the crystallization of $HfO_2$ is suppressed in the film having composition of HfSiON is as follows. A diffusion coefficient of Hf atoms becomes much smaller in the case where medium is SiON than in the case where medium is $SiO_2$. As shown in the samples A3 and A5, $HfO_2$ deposition occurs due to the annealing in the film consisting of Hf, Si and oxygen, and the film is separated into a $SiO_2$ region and $HfO_2$ region. This compositional separation is caused by a fact that $HfO_2$ is a thermally stable material phase with a low crystallization temperature while an Hf-added silicon oxide film ($Hf_xSi_{1-x}O_2$) is not the thermodynamically stable material phase, which is an unavoidable structure change. However, since the $HfO_2$ deposition in the Hf-added silicon oxide film is caused by the diffusion of the Hf atoms in the $SiO_2$ medium, it is possible to suppress the $HfO_2$ deposition by suppressing the diffusion.

It is obvious from the results shown in FIGS. 7B and 9B that the addition of nitrogen to the $SiO_2$ film can effectively suppress the diffusion of Hf. Also, it can be seen from FIG. 9B that a sufficient effect to suppress the Hf diffusion can be obtained even when nitrogen of about 3 atomic % is added. These effects can be explained as follows. A space in $SiO_2$ through which Hf diffuses becomes smaller due to lattice distortion caused by the nitrogen insertion. Accordingly, the diffusion of Hf is suppressed. Moreover, when a $SiO_2$ network is firmly maintained although nitrogen which has topologically different number of coupling hands is added, a structure distortion is generated over a very wide range around nitrogen. Since a space with a small volume is formed over the wide range, the effect can be obtained sufficiently even by adding a small amount of nitrogen.

As described above, in order to suppress the deposition of the metal oxide in the silicon oxide film to which the metal atoms are added, it is preferable to add nitrogen at least to a region to which the metal atoms are added. That is to say, it is preferable that the width of the nitrogen distribution is wider than at least the width of the Hf distribution, as shown in FIG. 1B. This allows the suppression of the compositional separation in the metal-added silicon oxide film.

4. MOSFET and Electrical Characteristics Thereof

Next, verification of a MOSFET device having the gate insulating film structure that is fabricated by using the above-mentioned Hf addition apparatus will be demonstrated. The inventors of the present application actually fabricated an MOSFE device having the above-described gate insulating film structure and investigated electrical characteristics thereof.

Figure 11A:
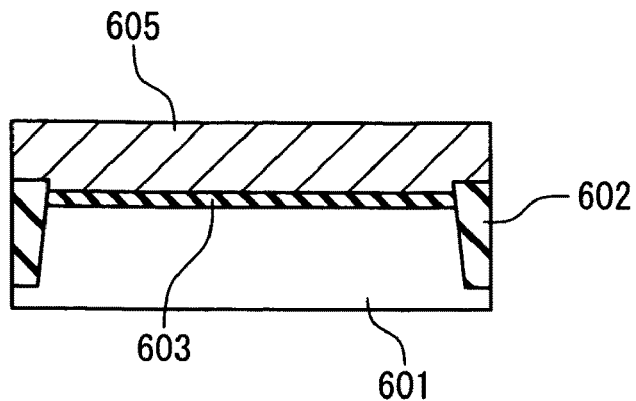
FIG. 11A is a cross-sectional view showing an example of a process of manufacturing a MOSFET device according to the present exemplary embodiment.

FIGS. 11A to 11F are cross-sectional views showing an example of a process of manufacturing the MOSFET device according to the present exemplary embodiment. First, as shown in FIG. 11A, a device isolation structure 602 is formed in a silicon substrate 601 based on an STI (Shallow Trench Isolation) technique. Subsequently, a gate insulating film 603 is formed on the silicon substrate 601 in a device region sandwiched between the device isolation structures 602.

The gate insulating film 603 is formed in accordance with the procedures shown in the foregoing FIGS. 2A to 2F. First, a silicon oxide film with a thickness of 1.9 nm for example is formed on the silicon substrate 601 by a RTO (Rapid Thermal Oxidation) method. Next, nitrogen of concentration of 3.8 atomic % is introduced by using a plasma nitriding method. After that, a post-annealing process is performed and a silicon oxynitride film is formed (see FIGS. 2A to 2C). It is possible by using the plasma nitriding method to localize a nitrogen distribution in the surface side of the insulating film. By using such a base oxynitride film, it is possible to suppress an initial diffusion of Hf to be deposited later into the base oxynitride film. As a result, it becomes possible to lower the nitrogen concentration and the Hf concentration at the interface between the gate insulating film and the silicon substrate.

Next, Hf is deposited by using the PVD apparatus in accordance with the aforementioned method. Then, an annealing process as a post process is performed in $NH_3$ atmosphere. Consequently, the nitrogen concentration in the insulating film is increased further (see FIGS. 2D and 2E). For example, the amount of nitrogen in the insulating film is 15 atomic % ($5 \times 10^{15}$ atoms/cm$^2$). At this time, the nitriding reaction occurs preferentially on the surface side, because Hf is present on the surface of the insulating film. Therefore, the nitrogen distribution in the insulating film becomes higher on the surface side and thus the structure according to the present exemplary embodiment can be realized. The nitrogen existing on the surface side suppresses the diffusion of Hf in the lateral direction and suppresses the aggregation of Hf at the time of activation annealing. Therefore, the carrier mobility at the silicon substrate interface is prevented from being influenced by scattering due to Hf. As a result, a high-speed operation of the device becomes possible. Moreover, since the diffusion of Hf in the lateral direction is prevented, the aggregation and crystallization of Hf are suppressed and thus the device having excellent reliability can be realized.

Figure 11B:
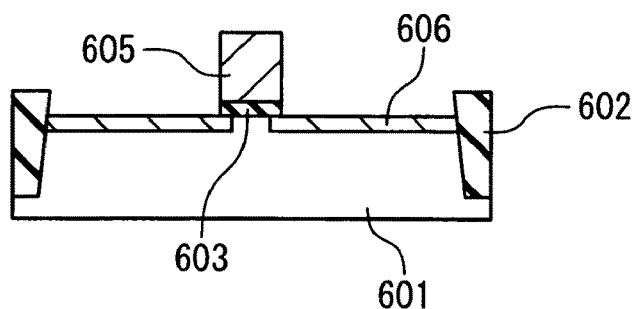
FIG. 11B is a cross-sectional view showing the example of the process of manufacturing the MOSFET device according to the present exemplary embodiment.
Figure 11C:
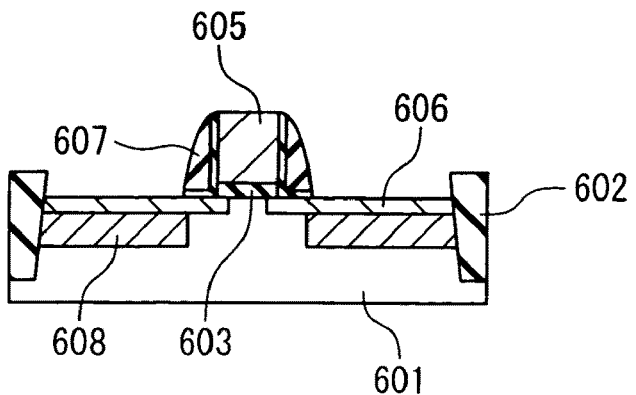
FIG. 11C is a cross-sectional view showing the example of the process of manufacturing the MOSFET device according to the present exemplary embodiment.

Next, as shown in FIG. 11A, a polysilicon film 605 with a thickness of 150 nm is formed on the gate insulating film 603. Next, the stacked film is processed by using a lithography technique and an RIE (Reactive Ion Etching) technique to form a gate electrode 605 as shown in FIG. 11B. Subsequently, an ion injection is performed by using the gate electrode 605 as a mask to form extension diffusion regions 606 in the silicon substrate 601 in a self-aligned manner. Next, a silicon nitride film and a silicon oxide film are blanket deposited in order, and then an etch-back process is performed. As a result, gate side walls 607 are formed as shown in FIG. 1C. Furthermore, an ion injection is performed again to form source/drain diffusion layers 608 through activation annealing.

Figure 11D:
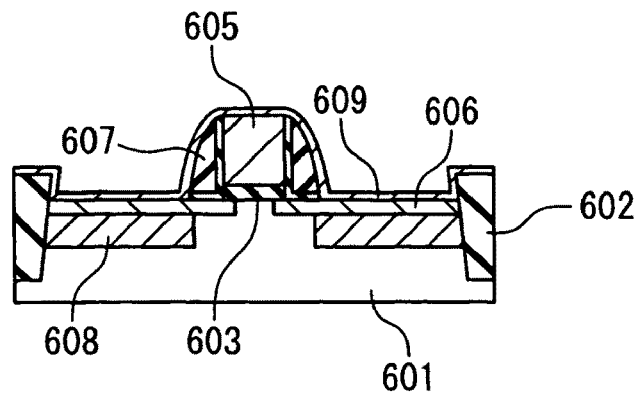
FIG. 11D is a cross-sectional view showing the example of the process of manufacturing the MOSFET device according to the present exemplary embodiment.
Figure 11E:
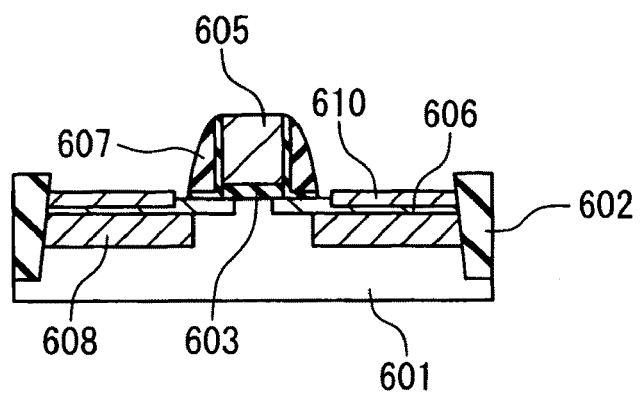
FIG. 11E is a cross-sectional view showing the example of the process of manufacturing the MOSFET device according to the present exemplary embodiment.
Figure 11F:
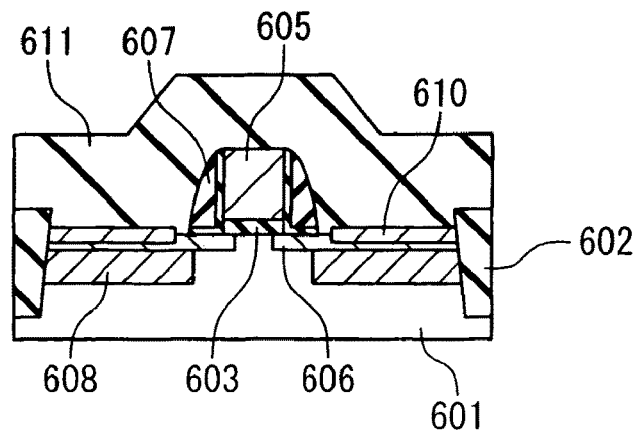
FIG. 11F is a cross-sectional view showing the example of the process of manufacturing the MOSFET device according to the present exemplary embodiment.

Next, as shown in FIG. 11D, a metal film 609 with a thickness of 20 nm is formed on the entire surface by a sputtering method. Next, as shown in FIG. 11E, a silicide layer 610 with a thickness of about 40 nm is formed exclusively on the source/drain diffusion layers 608 by a salicide technique. At this time, the gate electrode 605, the gate side walls 607 and the device isolation structure 602 are used as a mask. The silicide layer 610 is exemplified by Ni monosilicide (NiSi) that can most reduce a contact resistance. Also, Co silicide or Ti silicide may be used instead of Ni monosilicide. Furthermore, as shown in FIG. 11F, an interlayer insulating film 611 (for example, a silicon oxide film) is formed on the entire surface by a CVD (Chemical Vapor Deposition) method. Lastly, a wiring process is carried out and the MOSFET device is completed.

FIG. 12 shows an Id (Ig)-Vg characteristic of a PMOS transistor that was produced experimentally. More specifically, two kinds of processing were performed with respect to a non-channel-impurity-injected SiON gate insulating film in order to shift the threshold voltage by about 300 mV in the minus direction, and then a comparison was made. On the one hand, arsenic in a concentration of $1.5 \times 10^{14}$ atoms/cm$^2$ was injected into the channel region. On the other hand, Hf was formed with a concentration of $1.8 \times 10^{14}$ atoms/cm$^2$ on the SiON gate insulating film. In can be seen from FIG. 12 that better characteristics are obtained with regard to a driving current, an off current, a leakage current (Ig) and an S value when the threshold voltage is shifted by using Hf.

In order to obtain such a merit, the threshold voltage of the PMOS transistor needs to be controlled in a rage from −150 to −300 mV. The reason is that if the threshold voltage does not reach −150 mV, the channel injection amount on the NMOS side cannot be decreased and thus the improvement effect of the mobility cannot be obtained. Also, if the threshold voltage exceeds −300 mV, too large variation deteriorates a balance with a threshold voltage on the NMOS side, which causes deterioration of characteristics of the CMOSFET as a whole. FIG. 13 shows variations of the threshold voltage of the PMOS with respect to the Hf deposition amount. It can be seen from FIG. 13 that the Hf deposition amount for obtaining the desired threshold voltage (−150 to −300 mV) is in the range not less than $3 \times 10^{13}$ atoms/cm$^2$ and not more than $1.5 \times 10^{14}$ atoms/cm$^2$ as described above. By controlling the threshold voltage within the range, it is possible to enjoy the improvement effect of the device characteristics shown in FIG. 12.

As described above, it is possible to control the threshold voltage of the CMOSFET by adjusting the Hf concentration in the gate insulating film. By setting the Hf concentration to the range not less than $3 \times 10^{13}$ atoms/cm$^2$ and not more than $1.5 \times 10^{14}$ atoms/cm$^2$, the effect of the mobility improvement can be obtained.

5. Comparison of Electrical Characteristics

Hereinafter, the electrical characteristics will be compared between a device having the structure according to the present invention and a device having a structure different from the present invention. Effectiveness of the present invention is demonstrated through the comparison.

First Comparative Example

Figure 14A:
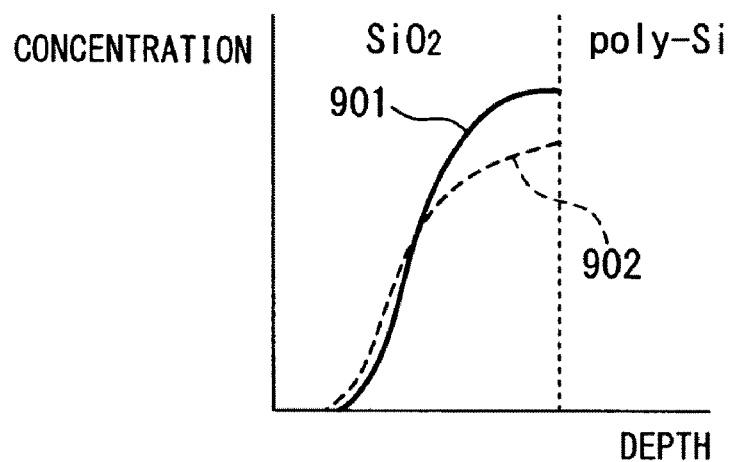
FIG. 14A is a graph showing an Hf distribution and a nitrogen distribution in the gate insulating film according to the present exemplary embodiment.
Figure 14B:
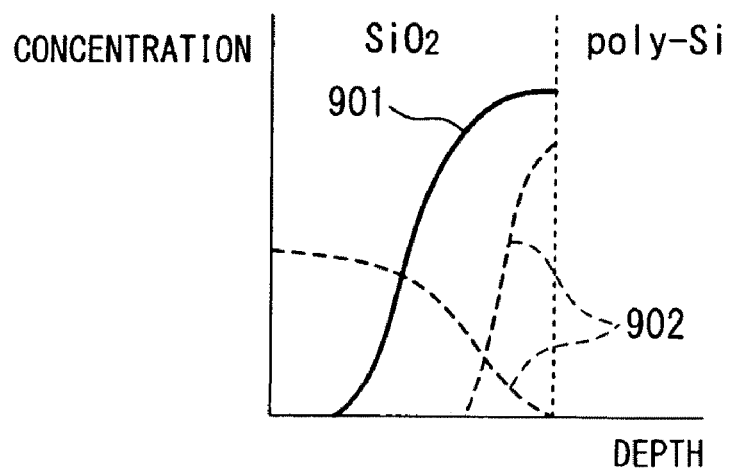
FIG. 14B is a graph showing an Hf distribution and a nitrogen distribution in a gate insulating film according to a first comparative example.

In a MOSFET device as a first comparison target, an oxynitride film in which a nitrogen concentration is high on the silicon substrate interface side is used as a gate insulating film. The MOSFET device as the comparison target was fabricated by the same processes as in the present exemplary embodiment except for the different base structure. FIG. 14A shows the Hf distribution and the nitrogen distribution in the gate insulating film according to the present exemplary embodiment, while FIG. 14B shows an Hf distribution and a nitrogen distribution in the gate insulating film according to the first comparative example. In FIGS. 14A and 14B, the Hf distribution is expressed by a line 901 and the nitrogen distribution is expressed by a dashed line 902. In FIG. 14B, two dashed lines 902 representing the nitrogen distribution are shown. These respectively correspond to a nitrogen profile in the base oxide film and a nitrogen profile formed at the time of the $NH_3$ process after Hf is deposited.

Figure 15:
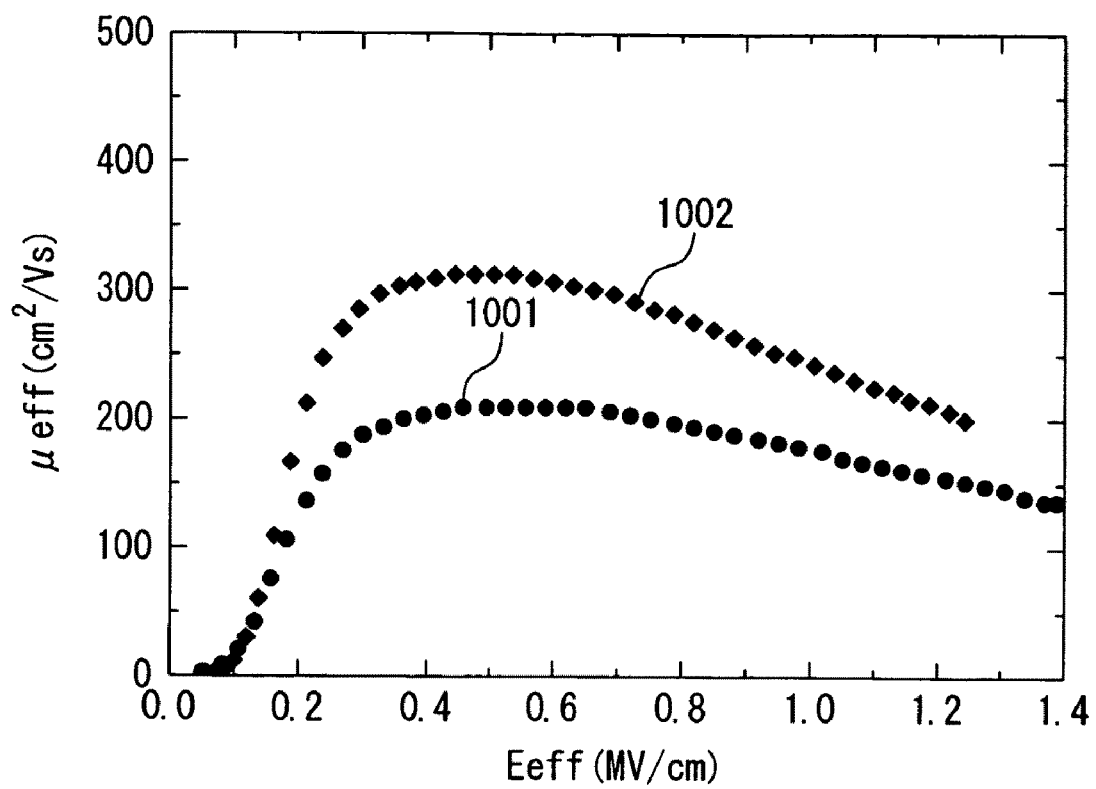
FIG. 15 is a graph showing a relationship between effective mobility of NMOS devices having the gate insulating film structures shown in FIGS. 14A and 14B and electric field intensity.

Mobility was calculated with regard to NMOS devices having the respective structures shown in FIGS. 14A and 14B. FIG. 15 shows the calculated mobility, wherein a longitudinal axis indicates effective mobility of electrons and an abscissa axis indicates electric field intensity. A reference numeral 1001 indicates the electron mobility in the case of the first comparative example where the nitrogen concentration has a peak on the substrate interface side. On the other hand, a reference numeral 1002 indicates the electron mobility in the case of the present exemplary embodiment where the nitrogen concentration has a peak on the gate insulating film/gate electrode interface side. As shown in FIG. 15, the electron mobility becomes higher in the case of the present exemplary embodiment than in the case of the first comparative example. For example, in the case of the first comparative example, the mobility when the electric field intensity is 0.6 MV/cm is reduced to about two-thirds. The reason is that if the nitrogen concentration has a peak on the substrate interface side, the fixed charges of the nitrogen atoms serve as the scattering factor of electrons.

Second Comparative Example

Figure 16A:
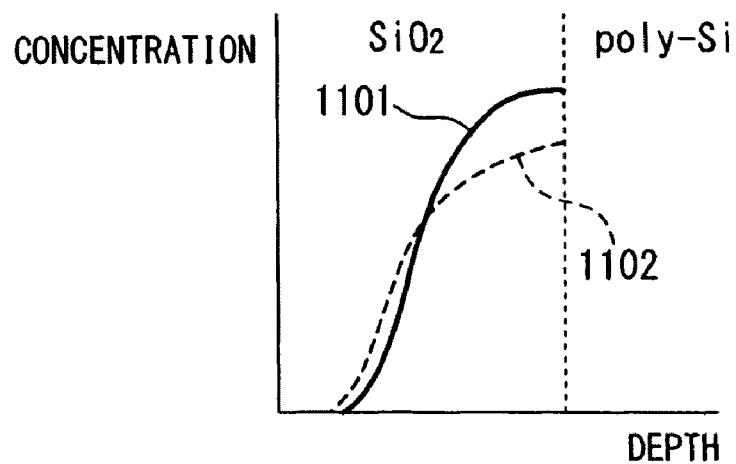
FIG. 16A is a graph showing an Hf distribution and a nitrogen distribution in the gate insulating film according to the present exemplary embodiment.
Figure 16B:
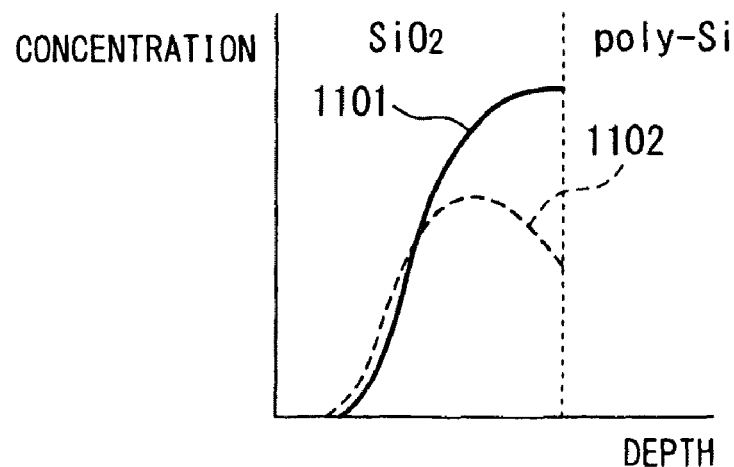
FIG. 16B is a graph showing an Hf distribution and a nitrogen distribution in a gate insulating film according to a second comparative example.

As a second comparison target, a MOSFET device was fabricated without performing the $NH_3$ process after the Hf deposition. The MOSFET device as the comparison target was fabricated by the same processes as in the present exemplary embodiment except for the $NH_3$ process. FIG. 16A shows the Hf distribution and the nitrogen distribution in the gate insulating film according to the present exemplary embodiment, while FIG. 16B shows an Hf distribution and a nitrogen distribution in the gate insulating film according to the second comparative example. In FIGS. 16A and 16B, the Hf distribution is expressed by a line 1101 and the nitrogen distribution is expressed by a dashed line 1102. In FIG. 16B, the nitrogen distribution decreases at the gate electrode/gate insulating film interface.

Figure 17:
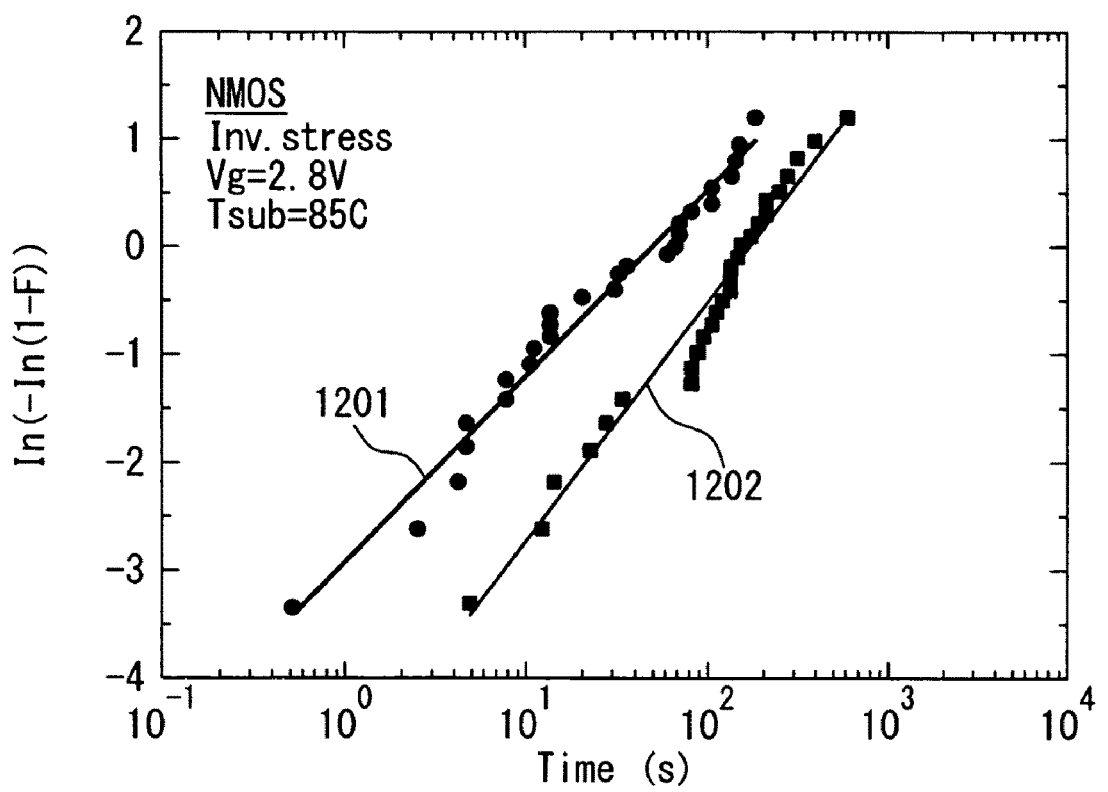
FIG. 17 is a graph showing TDDB characteristics of NMOS devices having the gate insulating film structures shown in FIGS. 16A and 16B.

With respect to NMOS devices having the respective structures shown in FIGS. 16A and 16B, a TDDB (Time Dependent Dielectric Breakdown) reliability assessment test of NMOS inversion region was conducted. FIG. 17 shows a result of the TDDB reliability assessment test, wherein a longitudinal axis indicates Weibull distribution. Here, a gate voltage Vg was set to +2.8V and a substrate temperature Tsub was set to 85 degrees centigrade. The breakdown determination was made at timing when the current value became 1.8 times the current value obtained immediately after the application of stress voltages.

In FIG. 17, a reference numeral 1201 indicates the case of the second comparative example where the nitrogen distribution is lowered on the gate electrode/gate insulating film interface side. On the other hand, a reference numeral 1202 indicates the case of the present exemplary embodiment where the nitrogen concentration has a peak on the gate electrode/gate insulating film interface side. In the case of the second comparative example, the Hf diffusion within a plane parallel to the gate electrode/gate insulating film interface is not suppressed, although the Hf diffusion toward the silicon substrate interface can be suppressed. As a result, the aggregation of Hf occurs during the thermal process such as the activation process, and hence in-plane evenness of Hf is deteriorated. In this case, spots of aggregated HF become leak paths through which a current is likely to flow. Therefore, the TDDB characteristics are deteriorated in the case of the second comparative example as compared with the present exemplary embodiment.

Third Comparative Example

Figure 18:
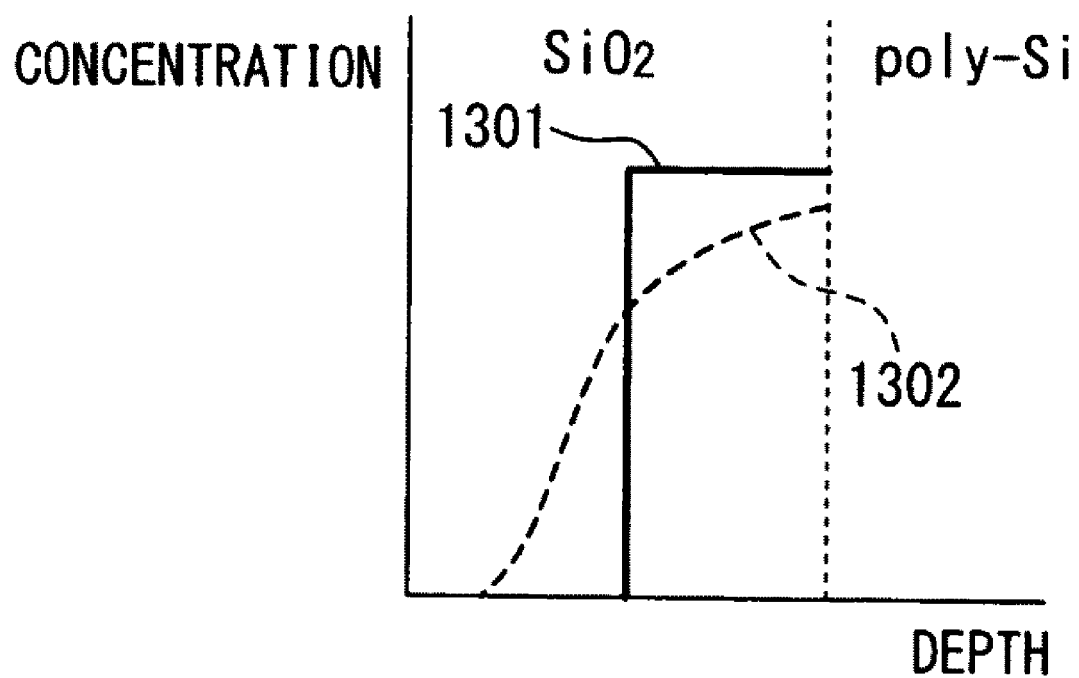
FIG. 18 is a graph showing an Hf distribution and a nitrogen distribution in a gate insulating film according to a third comparative example.

As a third comparison target, a MOSFET device having a steep Hf distribution was fabricated. More specifically, an $HfO_2$ film was formed by using the AL-CVD method. An oxynitride film was used as the base film, and the process temperature was set to not more than 400 degrees centigrade. A steep stacked structure was thus fabricated. FIG. 18 shows an Hf distribution and a nitrogen distribution in the gate insulating film according to the third comparative example. In FIG. 18, the Hf distribution is expressed by a line 1301 and the nitrogen distribution is expressed by a dashed line 1302. In FIG. 18, the Hf concentration changes extremely sharply in the gate insulating film.

Figure 19:
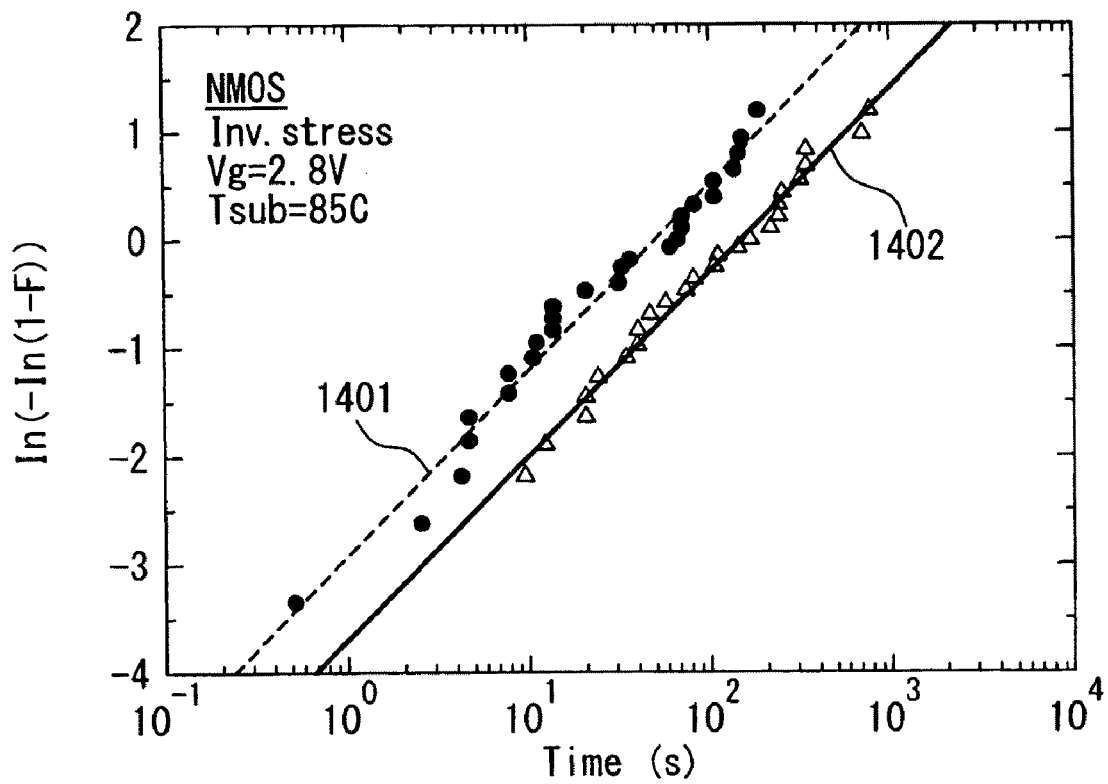
FIG. 19 is a graph showing TDDB characteristics of NMOS devices having the gate insulating film structures according to the present exemplary embodiment and the third comparative example.

With respect to NMOS devices having the structure shown in FIG. 18, a TDDB reliability assessment test of NMOS inversion region was conducted. FIG. 19 shows a result of the TDDB reliability assessment test, wherein a longitudinal axis indicates Weibull distribution. Here, a gate voltage Vg was set to +2.8V and a substrate temperature Tsub was set to 85 degrees centigrade. The breakdown determination was made at timing when the current value became 1.8 times the current value obtained immediately after the application of stress voltages.

In FIG. 19, a reference numeral 1401 indicates the case of the third comparative example where the Hf distribution changes steeply. On the other hand, a reference numeral 1402 indicates the case of the present exemplary embodiment. In the case of the third comparative example, an electric field along the vertical direction locally and strongly acts on a low permittivity layer in the gate insulating film between the gate electrode and the silicon substrate. As a result, an insulating film region on which the electric field strongly acts is preferentially broken-down. The broken-down portion becomes a leak path through which a current is likely to flow, which accelerates the breakdown. Therefore, the TDDB characteristics are deteriorated in the case of the third comparative example as compared with the present exemplary embodiment.

As described in the first to third comparative examples, it is preferable that the Hf distribution and the nitrogen distribution have maximum values on the gate electrode/gate insulating film interface side. Moreover, it is preferable that the Hf distribution and the nitrogen distribution decrease from the gate electrode/gate insulating film interface side toward the semiconductor layer side. As a result, the deterioration of mobility caused by Hf is suppressed and thus a device with excellent mobility can be realized. In addition, the local concentration of the electric filed is reduced and thus a device having electrical characteristics with high reliability can be realized.

Fourth Comparative Example

In the fourth comparative example, change in the electrical characteristics corresponding to change in the nitrogen concentration in the gate insulating film was examined. For that purpose, the condition of the $NH_3$ annealing process after the Hf deposition was changed variously. The other processes are the same as the above-mentioned processes. The threshold voltage of the MOSFET depends not only on the Hf deposition amount but also on the nitrogen concentration in the gate insulating film.

Figure 20:
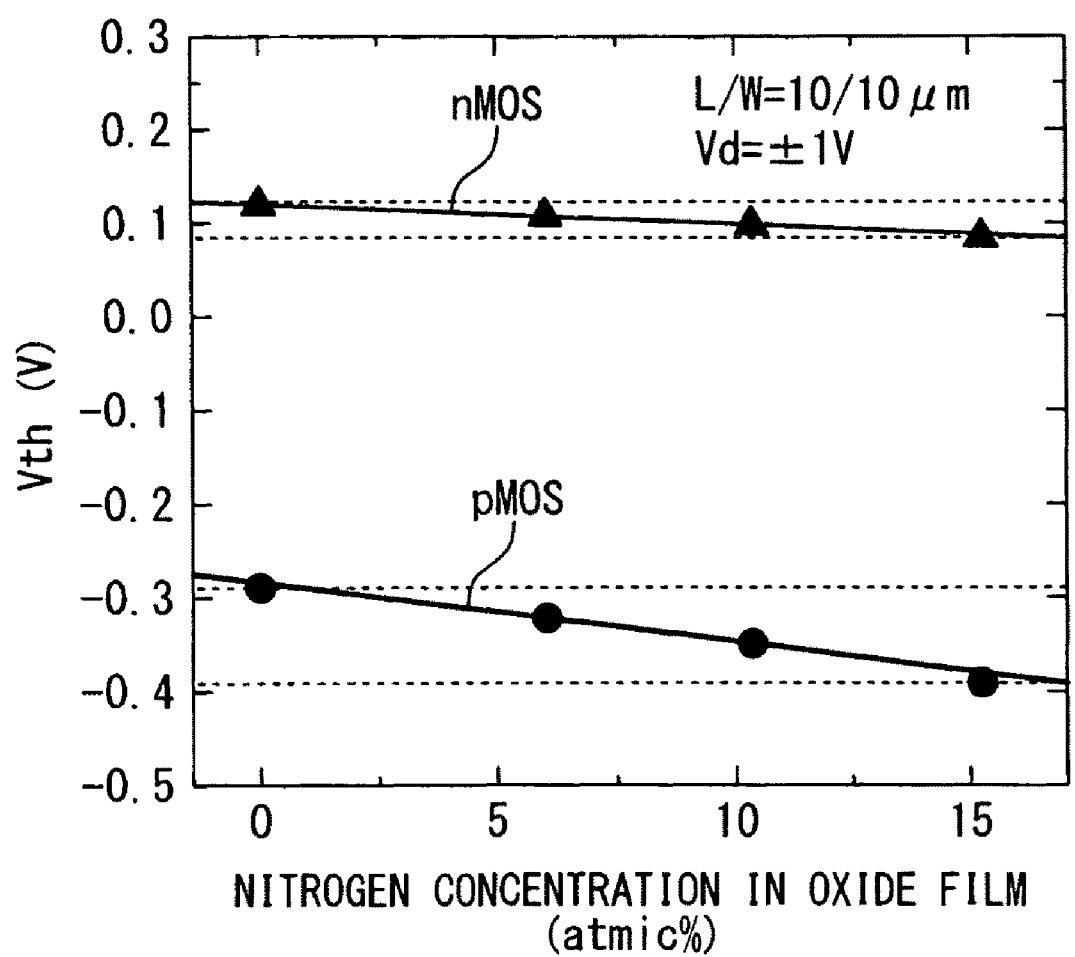
FIG. 20 is a graph showing a relationship between a nitrogen concentration in the gate insulating film and a shift amount of a threshold voltage.

FIG. 20 shows a relationship between the nitrogen concentration in the gate insulating film and a shift amount of the threshold voltage. Here, the Hf deposition amount was fixed to $2.2 \times 10^{14}$ atoms/cm$^2$. The nitrogen concentration can be controlled by changing a processing temperature and a processing time of the NH$_3$ annealing process. The nitrogen concentration was obtained by measuring samples that were processed under the same condition with respect to a wafer without patterns. As shown in FIG. 20, the threshold voltages of both of the PMOS and the NMOS shift to the minus direction as the nitrogen concentration is increased. The shift amount is different between the PMOS and the NMOS. The shift amount in the PMOS is about 100 mV, while the shift amount in the NMOS is about 30 mV which is about one-third of the case of the PMOS. The shifting of the threshold voltage is considered to be due to the fixed charges of nitrogen.

Figure 21:
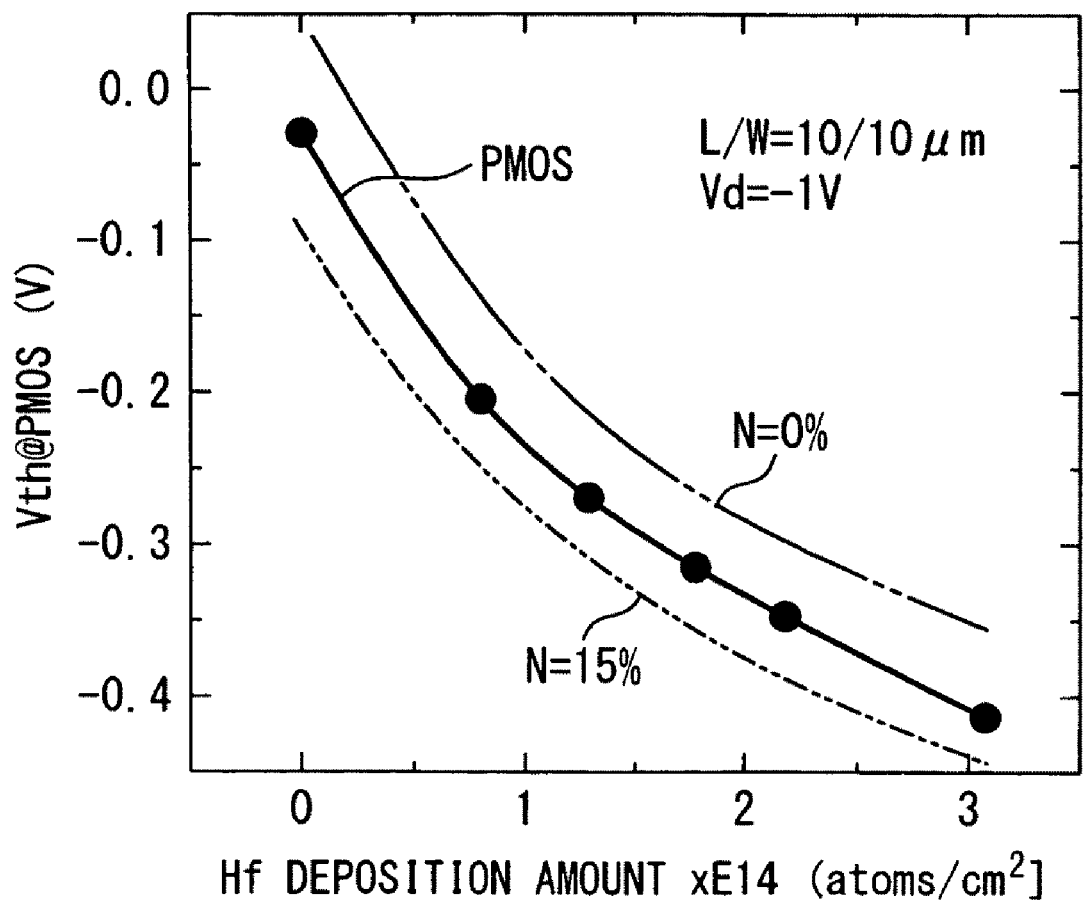
FIG. 21 is a graph showing a relationship between a shift amount of a threshold voltage of a PMOS and an Hf deposition amount with respect to various nitrogen concentrations.

FIG. 21 shows a relationship between the shift amount of the threshold voltage of the PMOS and the Hf deposition amount with respect to various nitrogen concentrations. That is, FIG. 21 shows influence of the nitrogen concentration on the dependence of the shift of the PMOS threshold voltage on the Hf deposition amount. As shown in FIG. 21, the threshold voltage is expected to shift by about 80 mV when the nitrogen concentration is changed from 0 atomic % to 15 atomic %. When converted to the Hf deposition amount, the change corresponds to about $8 \times 10^{13}$ atoms/cm$^2$. By designing the Hf deposition amount and the nitrogen amount in the gate insulating film with the use of such the relationship, it is possible to control the threshold voltage to a desired value.

Figure 22:
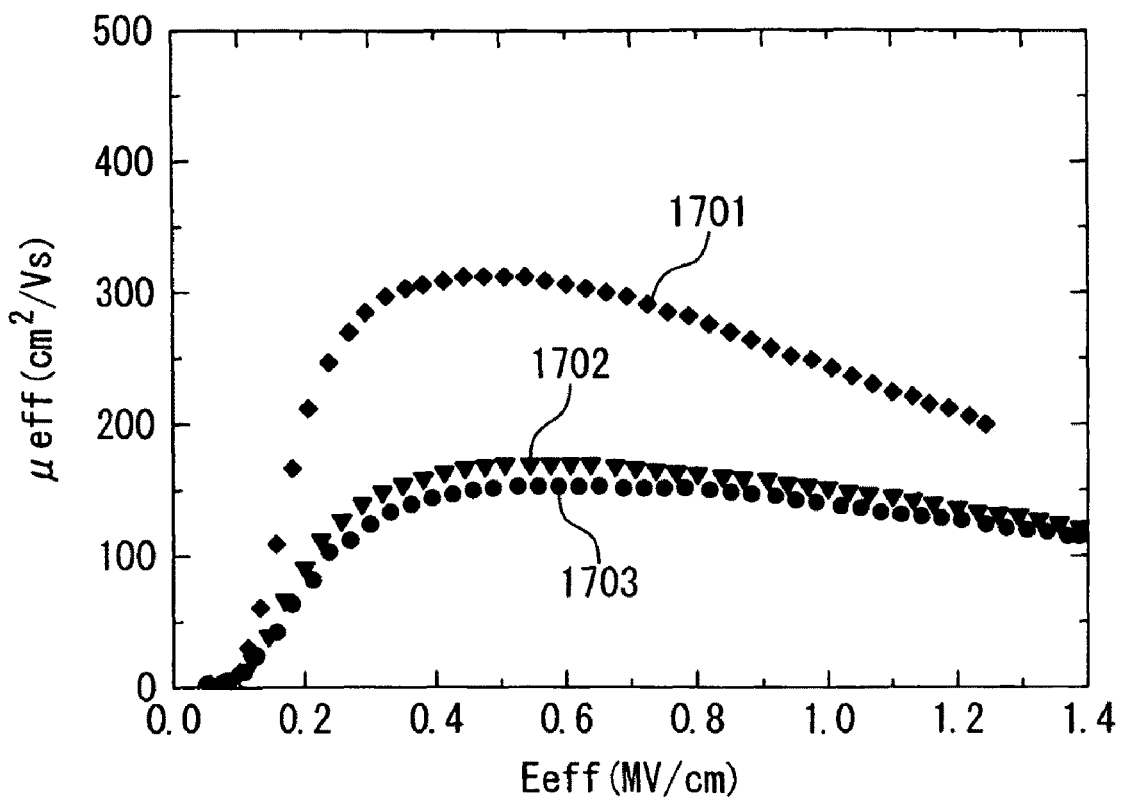
FIG. 22 is a graph showing electron mobility of NMOS transistors with respect to various nitrogen concentrations.

FIG. 22 shows the mobility of the NMOS transistor with respect to various nitrogen concentrations. In FIG. 22, a longitudinal axis indicates effective mobility of electron and an abscissa axis indicates electric field intensity. A reference numeral 1701 indicates the electron mobility in the case where the nitrogen concentration in the gate insulating film is 12 atomic %. A reference numeral 1702 indicates the electron mobility in the case where the nitrogen concentration in the gate insulating film is less than 3 atomic % ($5 \times 10^{14}$ atoms/cm$^2$). A reference numeral 1703 indicates the electron mobility in the case where the nitrogen concentration in the gate insulating film is more than 15 atomic % ($5 \times 10^{15}$ atoms/cm$^2$). Here, the thickness of the base SiO$_2$ film is 1.9 nm, and the Hf deposition amount is $2 \times 10^{14}$ atoms/cm$^2$. It can be seen from FIG. 22 that the electron mobility is significantly deteriorated when the nitrogen concentration is less than 3 atomic % or more than 15 atomic %. The reason is as follows. When the nitrogen concentration is low, it is not possible to suppress the diffusion of Hf, for example, during the heat treatment for activating the source/drain. In this case, Hf comes to the silicon substrate interface and the Hf becomes the scattering factor of electrons. On the other hand, when the nitrogen concentration is high, the nitrogen not only the gate electrode/gate insulating film interface but also the gate insulating film/silicon substrate interface. In this case, the nitrogen becomes the scattering factor of electrons.

Figure 23:
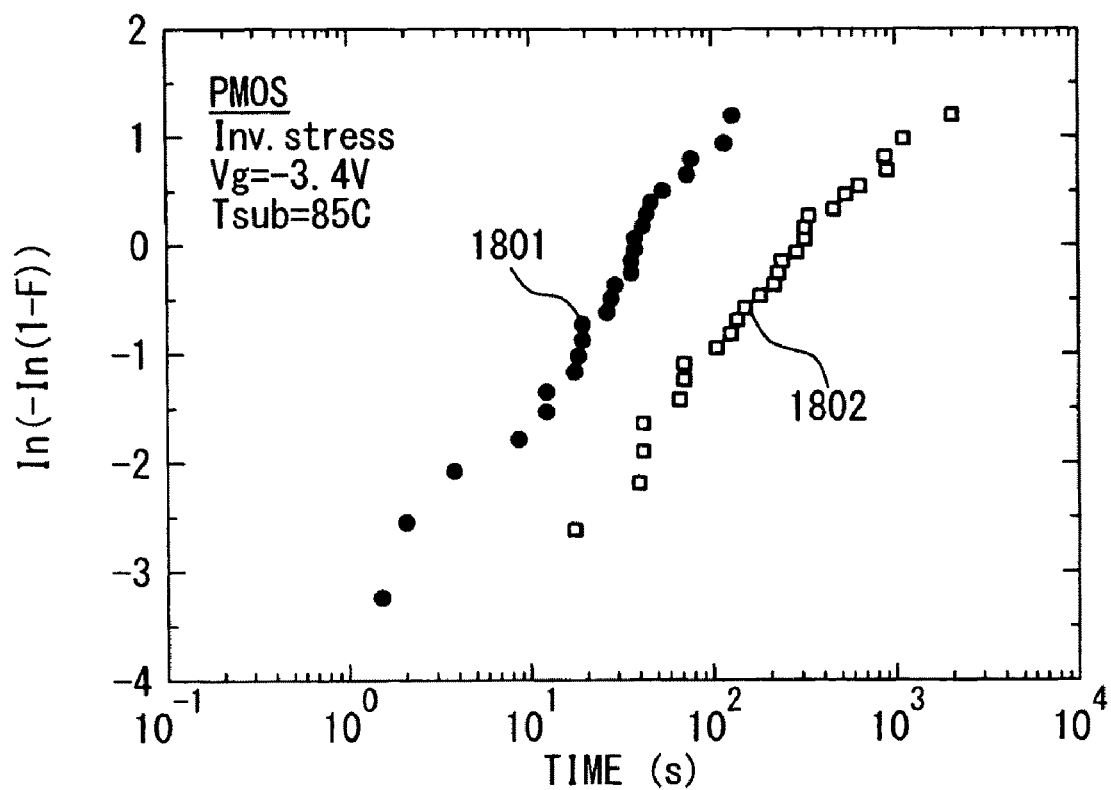
FIG. 23 is a graph showing results of TDDB reliability assessment tests of PMOS transistors with respect to various nitrogen concentrations.

FIG. 23 shows a result of the TDDB reliability assessment test with respect to the PMOS transistor. A longitudinal axis indicates Weibull distribution. Here, a gate voltage Vg was set to −3.4V and a substrate temperature Tsub was set to 85 degrees centigrade. The breakdown determination was made at timing when the current value became 1.8 times the current value obtained immediately after the application of stress voltages. In FIG. 23, a reference numeral 1801 indicates a Weibull plot in a case where the nitrogen concentration in the gate insulating film is less than 3 atomic % ($5 \times 10^{14}$ atoms/cm$^2$). On the other hand, a reference numeral 1802 indicates a Weibull plot in a case where the nitrogen concentration in the gate insulating film is 12 atomic %. Here, the thickness of the base SiO$_2$ film is 1.9 nm, and the Hf deposition amount is $2 \times 10^{14}$ atoms/cm$^2$. It can be seen from FIG. 23 that the TDDB characteristics are significantly deteriorated in the case where the nitrogen concentration in the gate insulating film is less than 3 atomic %. The reason is as follows. When the nitrogen concentration is low, heat resistance in the gate insulating film is lowered. Therefore, the aggregation and crystallization of Hf occur, for example, when the heat treatment for activating the source/drain is carried out. As a result, the breakdown voltage is decreased.

It should be noted that the nitrogen concentration in the gate insulating film can be easily obtained by using the XPS measurement for example. The nitrogen concentration in the gate insulating film can be calculated by irradiating a surface of a nitriding-processed sample with X-ray and detecting photoelectrons generated from the sample.

As described above, it is preferable to set the nitrogen concentration in the gate insulating film within the range not less than 3 atomic % and not more than 15 atomic % (from $5 \times 10^{14}$ atoms/cm$^2$ to $5 \times 10^{15}$ atoms/cm$^2$). Thus, the diffusion of Hf and nitrogen to the silicon substrate interface can be suppressed. As a result, it is possible to suppress deterioration of the mobility caused by Hf and nitrogen. Furthermore, the aggregation and crystallization reaction of Hf can be suppressed, which makes it possible to suppress deterioration of reliability.

Fifth Comparative Example

As a fifth comparative example, MOSFET devices having gate insulating films with different film thicknesses were fabricated. Each of the MOSFET devices was fabricated by the same processes as in the present exemplary embodiment except that the thickness of the base oxide film was different.

Figure 24A:
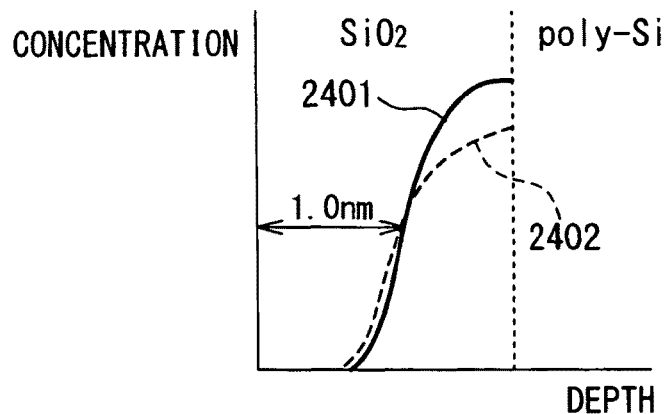
FIG. 24A is a graph showing an Hf distribution and a nitrogen distribution in the gate insulating film in a case where a thickness of a base oxide film is 1.9 nm.
Figure 24B:
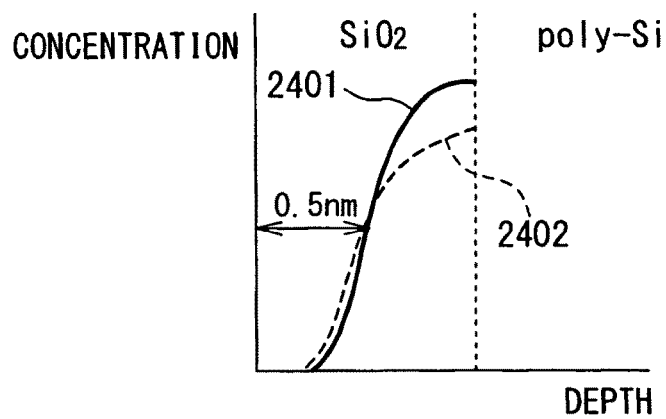
FIG. 24B is a graph showing an Hf distribution and a nitrogen distribution in the gate insulating film in a case where a thickness of a base oxide film is 1.3 nm.
Figure 24C:
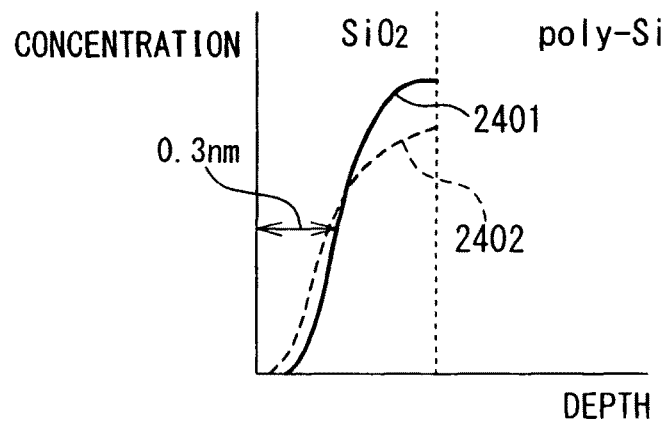
FIG. 24C is a graph showing an Hf distribution and a nitrogen distribution in the gate insulating film in a case where a thickness of a base oxide film is 1.0 nm.

FIGS. 24A to 24C show the Hf distribution and the nitrogen distribution in the gate insulating film and are related to cases where the thickness of the base oxide film is 1.9 nm, 1.3 nm and 1.0 nm, respectively. In FIGS. 24A to 24C, the Hf distribution is expressed by a line 2401 and the nitrogen distribution is expressed by a dashed line 2402. With regard to the Hf distribution, FIGS. 24A to 24C further show a thickness of an insulating film having Hf composition (Hf concentration) not more than the half of Hf composition (Hf concentration) at the gate electrode/gate insulating film interface. In the case of FIG. 24A (base oxide film thickness: 1.9 nm), for example, an insulating film region with a thickness of 1.0 nm has Hf composition not more than the half of Hf composition at the interface. The same applies to the cases of FIGS. 24B and 24C. As the thickness of the base oxide film is decreased, the insulating film region having Hf composition not more than the half of Hf composition at the interface becomes smaller.

Figure 25:
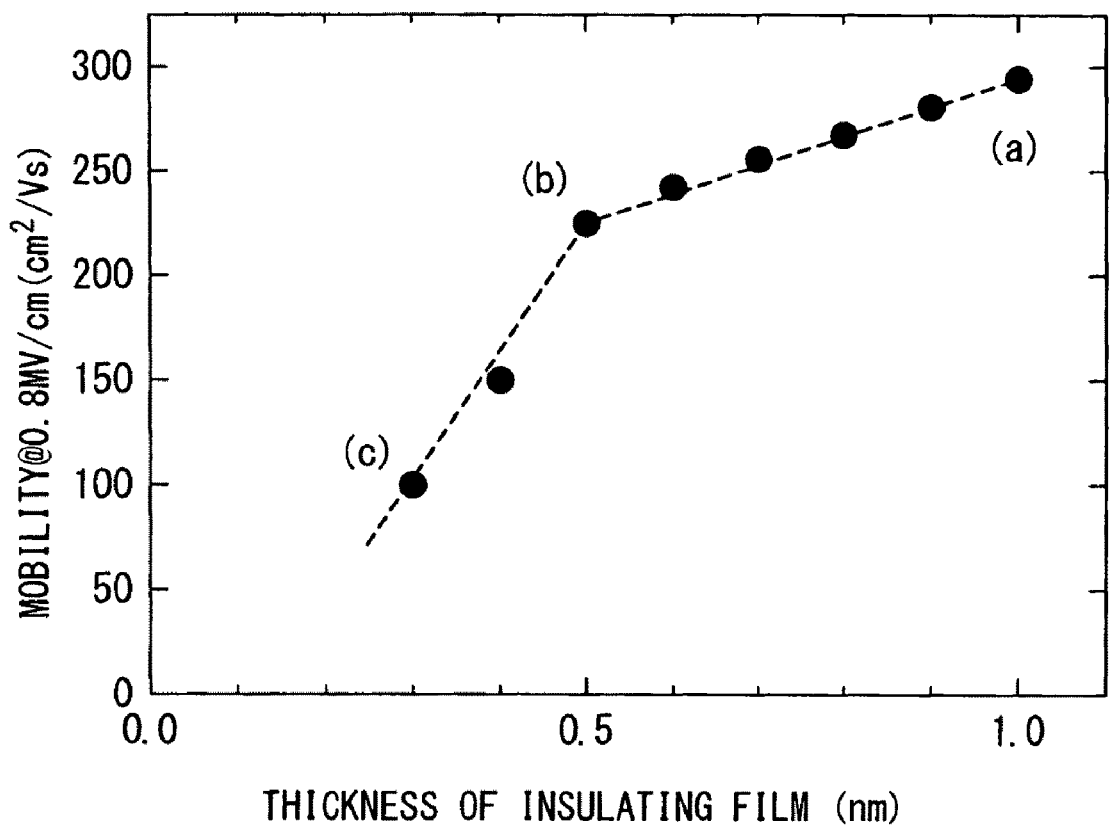
FIG. 25 is a graph showing a relationship between electron mobility and a thickness of an insulating film having Hf composition not more than half of Hf composition at an interface between a gate electrode and the gate insulating film.

FIG. 25 shows a relationship between the thickness of the insulating film and electron mobility. A longitudinal axis indicates electron mobility at 0.8 MV/cm. An abscissa axis indicates the thickness of the insulating film having Hf composition not more than the half of Hf composition at the gate electrode/gate insulating film interface. Points (a), (b) and (c) in FIG. 25 correspond to the structures shown in FIGS. 24A to 24C, respectively.

It can be seen from FIG. 25 that the electron mobility is greatly decreased when the abscissa axis value becomes less than 0.5 nm. The reason is that when Hf atoms come closer to the silicon substrate interface where electrons run, the electrons are scattered by the Hf atoms. It is therefore preferable that the thickness of the insulating film having Hf composition not more than the half of Hf composition at the gate electrode/gate insulating film interface is 0.5 nm or more. It is desirable that the distribution of the Hf concentration in the gate insulating film is so designed as to achieve the above feature. Consequently, it is possible to fabricate a device with less deterioration of the mobility.

The MOSFET semiconductor device and the processes of fabricating thereof according to the present invention have been described above in detail. The above-described processes are just an example, and other various processes can be employed. For example, the AL-CVD method can be used instead of the PVD method in the Hf deposition process. Even in this case, the same effects as described above can be obtained. In the above description, the case where Hf is used as the metal element has been explained as an example. According to the present invention, Al or Zr can also be used as the metal element. Even in this case, similar effects can be obtained. It should be noted that the concentrations of the metal element and nitrogen in the gate insulating film 2 can also be measured by another analysis method such as EELS (Electron Energy Loss Spectroscopy) or SIMS (Secondary Ion Mass Spectroscopy) for example.

The invention claimed is:

1. A semiconductor device having a field effect transistor, said field effect transistor comprising:
   a gate insulating film formed on a semiconductor layer; and
   a gate electrode formed on said gate insulating film,
   wherein said gate insulating film has a silicon oxide film including a metal element and nitrogen, and respective distributions of said metal element and said nitrogen in said gate insulating film have maximum values on an interface side between said gate insulating film and said gate electrode.

2. The semiconductor device according to claim 1, wherein the distributions of said metal element and said nitrogen in said gate insulating film decrease from the interface side between said gate insulating film and said gate electrode toward said semiconductor layer.

3. The semiconductor device according to claim 1, wherein in said gate insulating film, a thickness of an insulating film having metal element composition not more than half of composition of said metal element at the interface between said gate insulating film and said gate electrode is 0.5 nm or more.

4. The semiconductor device according to claim 1, wherein a width of the distribution of said nitrogen in said gate insulating film is wider than a width of the distribution of said metal element in said gate insulating film.

5. The semiconductor device according to claim 1, wherein said metal element comprises Hf.

6. The semiconductor device according to claim 1, wherein said metal element comprises Al or Zr.

7. The semiconductor device according to claim 1, wherein when all atoms of said metal element included in said gate insulating film are gathered on a plane, a surface concentration of said atoms is not less than $3 \times 10^{13}$ atoms/cm$^2$ and not more than $1.5 \times 10^{14}$ atoms/cm$^2$.

8. The semiconductor device according to claim 1, wherein a ratio of a total amount of said nitrogen to a total amount of all elements constituting said gate insulating film is not less than 3 atomic % and not more and 15 atomic %.

9. The semiconductor device according to claim 1, wherein when all atoms of said nitrogen included in said gate insulating film are gathered on a plane, a surface concentration of said atoms is not less than $5 \times 10^{14}$ atoms/cm$^2$ and not more than $5 \times 10^{15}$ atoms/cm$^2$.

* * * * *